United States Patent
Nagai et al.

(10) Patent No.: US 11,296,136 B2
(45) Date of Patent: Apr. 5, 2022

(54) IMAGING APPARATUS AND MANUFACTURING METHOD FOR IMAGING APPARATUS

(71) Applicant: SONY SEMICONDUCTOR SOLUTIONS CORPORATION, Kanagawa (JP)

(72) Inventors: Nobuyuki Nagai, Kanagawa (JP); Shusaku Yanagawa, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 30 days.

(21) Appl. No.: 16/640,957

(22) PCT Filed: Jul. 6, 2018

(86) PCT No.: PCT/JP2018/025629
§ 371 (c)(1),
(2) Date: Feb. 21, 2020

(87) PCT Pub. No.: WO2019/044172
PCT Pub. Date: Mar. 7, 2019

(65) Prior Publication Data
US 2020/0212096 A1    Jul. 2, 2020

(30) Foreign Application Priority Data
Aug. 29, 2017 (JP) .............................. JP2017-164240

(51) Int. Cl.
*H01L 27/146* (2006.01)

(52) U.S. Cl.
CPC .. *H01L 27/14623* (2013.01); *H01L 27/14618* (2013.01); *H01L 27/14627* (2013.01); *H01L 27/14685* (2013.01)

(58) Field of Classification Search
CPC ......... H01L 27/14623; H01L 27/14618; H01L 27/14627; H01L 27/14685;
(Continued)

(56) References Cited

U.S. PATENT DOCUMENTS

| | | | | |
|---|---|---|---|---|
| 6,762,796 | B1 * | 7/2004 | Nakajoh | .......... H01L 27/14618 |
| | | | | 348/340 |
| 8,514,317 | B2 * | 8/2013 | Lin | .......................... G02B 7/02 |
| | | | | 348/340 |

(Continued)

FOREIGN PATENT DOCUMENTS

| | | |
|---|---|---|
| CN | 101312206 | 11/2008 |
| CN | 101539707 A | 9/2009 |

(Continued)

OTHER PUBLICATIONS

International Search Report and Written Opinion prepared by the Japanese Patent Office dated Aug. 6, 2018, for International Application No. PCT/JP2018/025629.

*Primary Examiner* — Jonathan Han
(74) *Attorney, Agent, or Firm* — Sheridan Ross P.C.

(57) ABSTRACT

In an imaging apparatus provided with a substrate having transparency, warping of the substrate is prevented while stray light is shielded. The imaging apparatus includes a sensor chip, a transparent substrate, a light shielding wall, and an optical filter. In this imaging apparatus, a solid-state imaging element is provided in a light receiving region of the sensor chip. Furthermore, in the imaging apparatus, the transparent substrate is equipped on an outer edge portion of the sensor chip. In addition, in the imaging apparatus, the light shielding wall shields light that passes through the transparent substrate and enters the front light receiving region. The light shielding wall is formed on the optical filter.

20 Claims, 22 Drawing Sheets

(58) Field of Classification Search
CPC . H01L 27/14625; H01L 27/146; H04N 5/225; H04N 5/369; G02B 5/22; G03B 11/00; G03B 17/02
See application file for complete search history.

(56) References Cited

U.S. PATENT DOCUMENTS

| | | | |
|---|---|---|---|
| 2003/0184885 | A1 | 10/2003 | Tansho |
| 2006/0006486 | A1* | 1/2006 | Seo .................. H01L 31/02325 257/433 |
| 2010/0321563 | A1* | 12/2010 | Kume ............... H01L 27/14685 348/374 |
| 2013/0127000 | A1* | 5/2013 | Oganesian ........ H01L 27/14618 257/432 |
| 2017/0180613 | A1 | 6/2017 | Dobashi et al. |
| 2017/0283587 | A1* | 10/2017 | Hamada .................. G03F 7/038 |

FOREIGN PATENT DOCUMENTS

| | | |
|---|---|---|
| CN | 102646690 A | 8/2012 |
| CN | 204481931 | 7/2015 |
| CN | 105573020 | 5/2016 |
| CN | 205374936 | 7/2016 |
| CN | 105842961 | 8/2016 |
| CN | 106371242 | 2/2017 |
| CN | 206023924 | 3/2017 |
| CN | 206136093 | 4/2017 |
| JP | 2014-216394 | 11/2014 |
| JP | 2015-099262 | 5/2015 |
| JP | 2016092388 A | 5/2016 |
| JP | 2017-098525 | 6/2017 |
| KR | 20080014448 A | 2/2008 |
| KR | 20090048920 A | 5/2009 |
| WO | WO 2016/009833 | 1/2016 |
| WO | WO 2017/015801 | 2/2017 |

* cited by examiner a b a b c d a b c d a b a b a b a b a b a b c

IMAGING APPARATUS AND MANUFACTURING METHOD FOR IMAGING APPARATUS

CROSS REFERENCE TO RELATED APPLICATIONS

This application is a national stage application under 35 U.S.C. 371 and claims the benefit of PCT Application No. PCT/JP2018/025629 having an international filing date of 6 Jul. 2018, which designated the United States, which PCT application claimed the benefit of Japanese Patent Application No. 2017-164240 filed 29 Aug. 2017, the entire disclosures of each of which are incorporated herein by reference.

TECHNICAL FIELD

The present technology relates to an imaging apparatus and a manufacturing method for the imaging apparatus. In detail, the present technology relates to an imaging apparatus that shields unnecessary light entering a solid-state imaging element, and a manufacturing method for the imaging apparatus.

BACKGROUND ART

Conventionally, a substrate made by glass having a coefficient of thermal expansion (CTE) close to that of silicon has been used to prevent the substrate from warping due to temperature fluctuations. For example, there has been proposed an imaging apparatus provided with a semiconductor chip provided with a solid-state imaging element, and a substrate with transparency made by glass and bonded to the semiconductor chip (see, for example, Patent Document 1). In this imaging apparatus, a light shielding film is formed on an end surface of the substrate in order to shield unnecessary light (stray light) that has passed through the substrate having transparency.

CITATION LIST

Patent Document

Patent Document 1: Japanese Patent Application Laid-Open No. 2014-216394

SUMMARY OF THE INVENTION

Problems to be Solved by the Invention

In the above-described conventional technology, since the substrate is made by glass, it is possible to suppress warping of the substrate due to temperature fluctuations. However, when the light shielding film is formed by heat treatment or the like, there is a possibility that the heat treatment causes warping of the substrate having transparency. When the substrate is warped, the semiconductor chip bonded to the substrate is also warped, and the image plane of the solid-state imaging element is distorted, and the image quality of image data is degraded. On the other hand, if the light shielding film is not provided, the substrate is not warped but stray light cannot be shielded. Thus, there is a disadvantage that it is difficult to prevent warping of the substrate having transparency while shielding stray light.

The present technology has been created in view of such a situation, and an object of the present technology is to prevent warping of a substrate having transparency while shielding stray light in an imaging apparatus provided with the substrate.

Solutions to Problems

The present technology has been made to resolve the above-described disadvantage point, and a first aspect thereof is an imaging apparatus including: a sensor chip in which a solid-state imaging element is provided in a light receiving region; a transparent substrate equipped on an outer edge portion of the sensor chip; a light shielding wall that shields light that passes through the transparent substrate and enters the light receiving region; and an optical filter on which the light shielding wall is formed, and a manufacturing method for the imaging apparatus. This brings about the action that the light that passes through the transparent substrate and enters the light receiving region is shielded by the light shielding wall formed on the optical filter.

Furthermore, this first aspect may further include a flexible material filled between the light shielding wall and the transparent substrate. This brings about the action that mixing of dust from a gap between the light shielding wall and the transparent substrate is prevented.

In addition, in this first aspect, the light shielding wall may include a cured ultraviolet curable resin. This brings about the action that the light shielding wall is formed without heating.

In addition, in this first aspect, the light shielding wall may include a cured thermosetting resin. This brings about the action that the light shielding wall having a complicated shape can be formed easily.

In addition, in this first aspect, the light shielding wall may have an L-shaped cross section, and an inner edge portion of the transparent substrate may be provided with a step that restricts a movement of the optical filter in a direction parallel to a plane of the sensor chip. This brings about the action that collision between a side surface of the optical filter and a side surface of the transparent substrate is suppressed.

In addition, in this first aspect, the light shielding wall may protrude in a direction perpendicular to the light receiving region, and the light shielding wall may be formed in a vicinity of the wiring substrate on a surface of the optical filter facing the light receiving region, out of two surfaces of the optical filter. This brings about the action that the light that passes through the transparent substrate and enters the light receiving region is shielded by a part of the light shielding wall that protrudes in the direction perpendicular to the light receiving region.

In addition, this first aspect may further include: a lens barrel; and a partition plate whose side surface is connected to an inner wall of the lens barrel, in which a surface of the optical filter on which the light shielding wall is not formed, out of the two surfaces of the optical filter, may be adhered to the partition plate. This brings about the action that a gap between the optical filter and the partition plate is eliminated.

Effects of the Invention

According to the present technology, in an imaging apparatus provided with a substrate having transparency, an excellent effect of preventing warping of the substrate while shielding stray light can be achieved. Note that the effects described herein are not necessarily limited and any effects described in the present disclosure may be applied.

MODE FOR CARRYING OUT THE INVENTION

Modes for carrying out the present technology (hereinafter, referred to as embodiments) will be described below. The description will be given in the following order.

1. First Embodiment (Example in which Light Shielding Wall is Formed on Optical Filter)
2. Second Embodiment (Example in which Light Shielding Wall is Formed on Optical Filter and Flexible Material is Filled between Light Shielding Wall and Wiring Substrate)
3. Third Embodiment (Example in which Light Shielding Wall is Formed on Optical Filter by Thermosetting Resin)
4. Fourth Embodiment (Example in which Light Shielding Wall is Formed on Optical Filter whose Movement is Restricted by Step)
5. Application Example to Endoscopic Surgery System
6. Application Example to Moving Body 1. First Embodiment

[Configuration Example of Imaging Apparatus]

Figure 1:
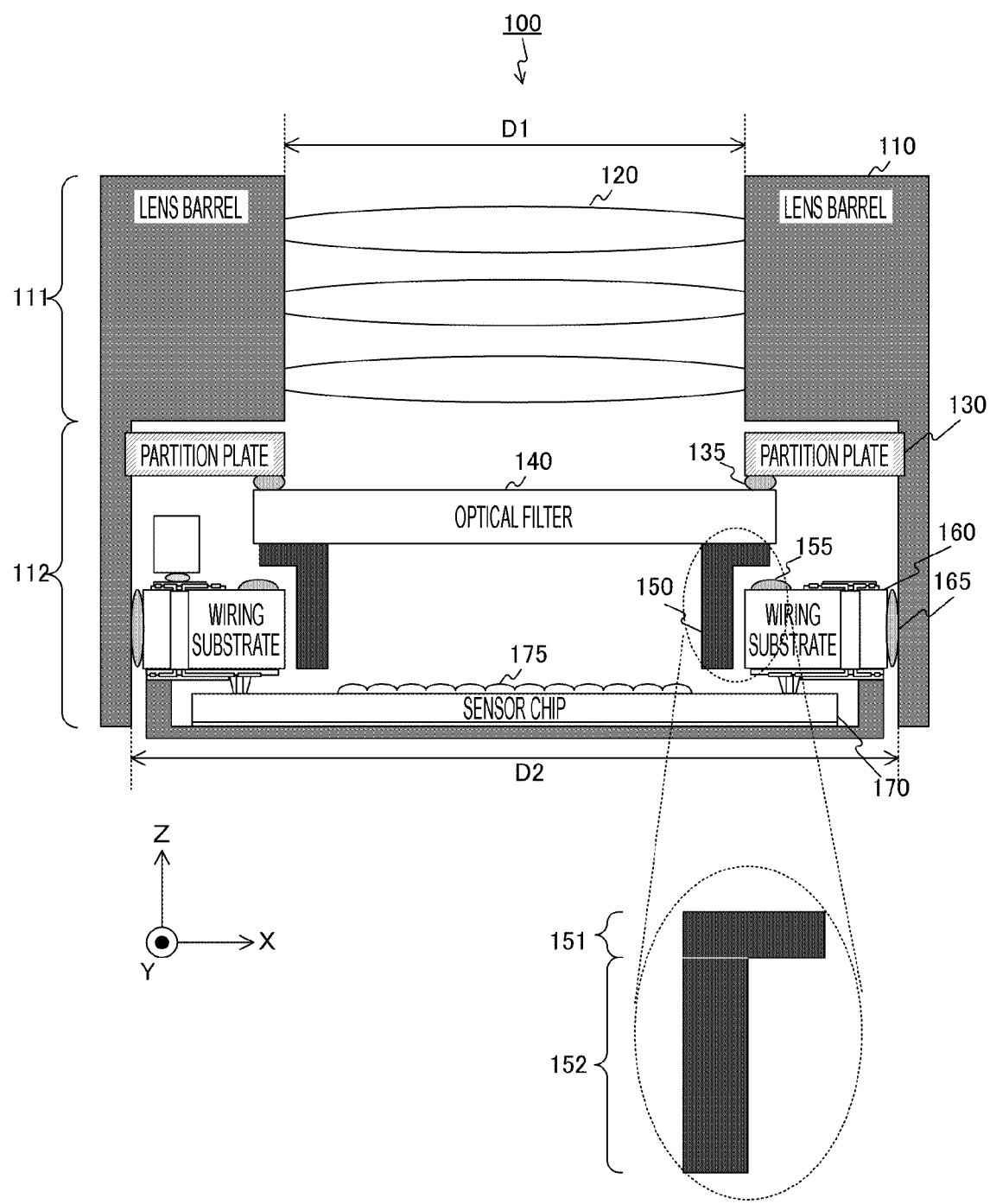
FIG. 1 is an example of a cross-sectional view of an imaging apparatus according to a first embodiment of the present technology.

FIG. 1 is an example of a cross-sectional view of an imaging apparatus 100 according to a first embodiment of the present technology. This imaging apparatus 100 is an apparatus for capturing image data, and includes a lens barrel 110, an imaging lens 120, a partition plate 130, an optical filter 140, a light shielding wall 150, a wiring substrate 160, and a sensor chip 170. In FIG. 1, parts other than the lens barrel 110 and the like in the imaging apparatus 100, for example, a display unit and an operation unit, are omitted. An electronic apparatus such as a smartphone or a personal computer having an imaging function, as well as a digital camera, is assumed as the imaging apparatus 100.

The lens barrel 110 is a member having a cylindrical hollow with a step in the middle. The diameter of the hollow changes from one of D1 and D2 to the other at this step part as a boundary. Here, D1 and D2 represent real numbers, and D1 is defined to be smaller than D2. A part with a diameter of D1 is a lens placement portion 111, and the imaging lens 120 is mounted on this part. Meanwhile, a part with a diameter of D2 is a chip placement portion 112, and the partition plate 130, the optical filter 140, the light shielding wall 150, the wiring substrate 160, and the sensor chip 170 are placed in this part.

The imaging lens 120 is an optical member that converges entering light and guides the converged light to the sensor chip 170. Hereinafter, the optical axis of the imaging lens 120 (in different terms, the central axis of the lens barrel 110) is defined as a Z axis. Furthermore, a predetermined axis that is perpendicular to the Z axis and parallel to one side of the sensor chip 170 is defined as an X axis. An axis parallel to the X axis and the Z axis is defined as a Y axis.

The partition plate 130 is a member whose side surface is connected to an inner wall of the chip placement portion 112 in the lens barrel 110. This partition plate 130 has an opening portion having a shape (such as a circle or a rectangle) resembling the shape of the optical filter 140 when viewed in the Z direction.

The optical filter 140 is an optical member that allows light in a predetermined wavelength range to pass through. For example, an infra-red cut filter (IRCF) that shields infrared light and allows light (such as visible light) other than infrared light to pass through is used as the optical filter 140. This optical filter 140 is placed between the imaging lens 120 and the sensor chip 170. Then, the light shielding wall 150 is formed in the vicinity of an inner end portion of the wiring substrate 160 on a surface of the optical filter 140 facing the sensor chip 170, out of two surfaces of the optical filter 140. Here, "vicinity" means that a distance from the inner end portion of the wiring substrate 160 to the light shielding wall 150 falls within a certain distance in the X-axis direction or the Y-axis direction.

Meanwhile, an outer edge portion of the optical filter 140 is adhered to the partition plate 130 by an adhesive 135 on a surface of the optical filter 140 on a light receiving side (on the side of the imaging lens 120), out of the two surfaces of the optical filter 140.

The wiring substrate 160 is a substrate with transparency equipped on an outer edge portion of the sensor chip 170. For example, a glass substrate made by glass is used as the wiring substrate 160. For example, a variety of circuits such as a circuit that processes image data from the sensor chip 170 and a circuit that supplies a control signal to the sensor chip 170 are placed on this wiring substrate 160. Furthermore, a side surface of the wiring substrate 160 and an inner wall of the lens barrel 110 are adhered to each other by an adhesive 165. Note that the wiring substrate 160 is an example of a transparent substrate described in the claims.

The light shielding wall 150 shields stray light that passes through the wiring substrate 160 and enters a light receiving region of the sensor chip 170. The occurrence of flare and ghost can be suppressed by shielding stray light. The light shielding wall 150 is constituted by a bottom portion 151 and a protruding portion 152. The bottom portion 151 is a part in close contact with the optical filter 140. Meanwhile, the protruding portion 152 is a part protruding in the Y-axis direction from an inner edge portion of the bottom portion 151. The light shielding wall 150 constituted by these bottom portion 151 and protruding portion 152 has a cross-sectional shape of a letter "L". Furthermore, a certain gap (in other words, a clearance) is provided between the light shielding wall 150, and the wiring substrate 160 and the sensor chip 170 such that these members do not contact each other.

The sensor chip 170 is a semiconductor chip in which a solid-state imaging element 175 is provided in the light receiving region. An outer edge portion of this sensor chip 170 is bonded to the wiring substrate 160 on a surface of the sensor chip 170 facing the imaging lens 120, out of two surfaces of the sensor chip 170. The solid-state imaging element 175 captures image data. For example, a complementary metal oxide semiconductor (CMOS) image sensor or the like is used as the solid-state imaging element 175.

Figure 2:
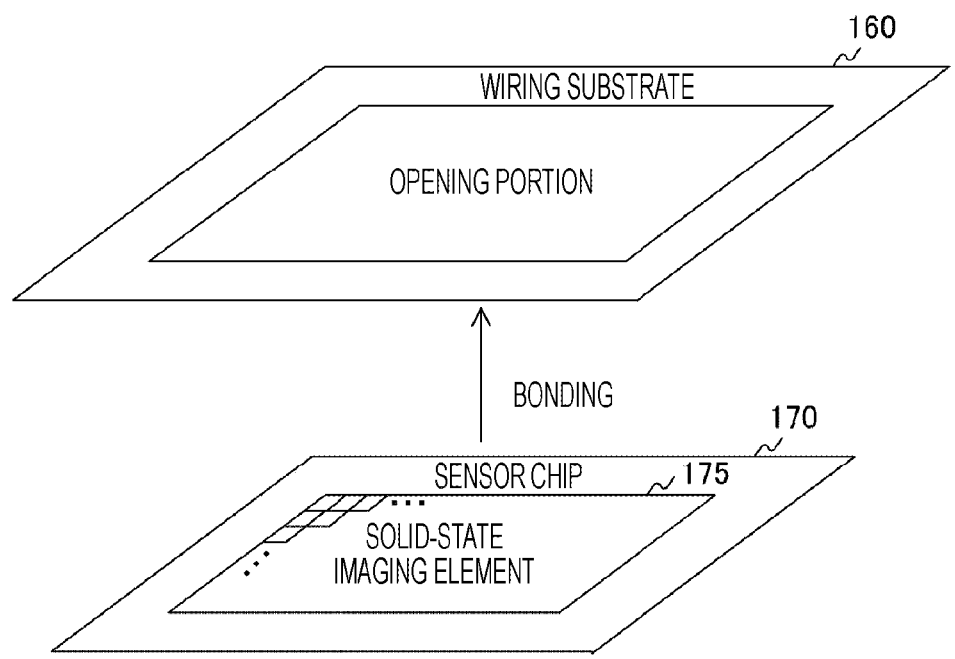
FIG. 2 is an example of perspective views of a wiring substrate and a sensor chip according to the first embodiment of the present technology.
Figure 2:
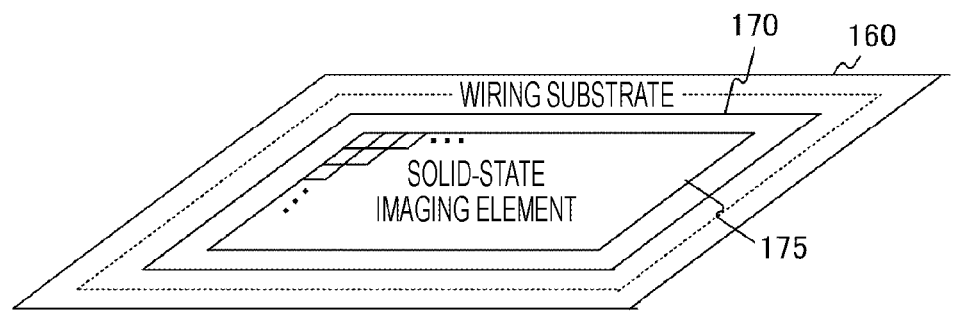
Figure 2:
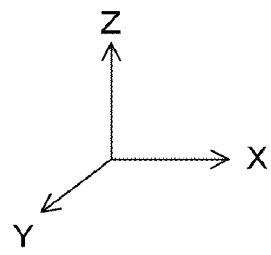

FIG. 2 is an example of perspective views of the wiring substrate 160 and the sensor chip 170 according to the first embodiment of the present technology. In FIG. 2, a is a perspective view of the wiring substrate 160 and the sensor chip 170 before being bonded, and b of FIG. 2 is a perspective view of the wiring substrate 160 and the sensor chip 170 after being bonded.

As exemplified in a of FIG. 2, the shape of the outer edge of the wiring substrate 160 is, for example, rectangular when viewed in the Z-axis direction. Furthermore, the wiring substrate 160 is provided with a rectangular opening portion. In addition, the shape of the sensor chip 170 is also rectangular, and a part of the sensor chip 170 other than the outer edge portion is used as the light receiving region. The rectangular solid-state imaging element 175 is provided in this light receiving region. Then, the outer edge portion of the sensor chip 170 is bonded to an inner edge portion of the wiring substrate 160. Additionally, the shape of the opening portion resembles the shape of the solid-state imaging element 175 when viewed in the Z-axis direction, and the area of the opening portion is defined to be larger than the area of the solid-state imaging element 175. With this structure, as exemplified in b of FIG. 2, the entire surface of the solid-state imaging element 175 is exposed from the opening portion in the bonded state.

Here, in general, the CTE of the glass substrate can be made equivalent to the CTE of a silicon substrate. Furthermore, the glass substrate has relatively high flatness. For this reason, by using the glass substrate as the wiring substrate 160, warping due to thermal expansion of the wiring substrate 160 can be suppressed. However, since the glass substrate is transparent, there is a possibility that unnecessary light (stray light) that has passed through the glass substrate enters the light receiving region, and such stray light needs to be shielded by the light shielding wall 150.

If the wiring substrate 160 is warped, the wiring substrate 160 is no longer flat, and there is thus a possibility that the sensor chip 170 bonded to the wiring substrate 160 is also warped. If the sensor chip 170 is warped, the image plane becomes non-flat, and there is a possibility that the image quality of image data is degraded. In particular, the thinner the wiring substrate 160 and the sensor chip 170, the more remarkable the disadvantage of image quality degradation due to warping. In addition, the higher the resolution of the solid-state imaging element 175, the shallower the focal depth tends to be, and the disadvantage of image quality degradation due to warping becomes more remarkable.

As described above, in the configuration in which the light shielding film is formed on an end surface of the wiring substrate by heat treatment or the like, there is a possibility that the wiring substrate is warped by the heat treatment. However, in the imaging apparatus 100, the light shielding wall 150 is formed not on the wiring substrate 160 but on the optical filter 140. Besides, since the wiring substrate 160 is formed separately from the optical filter 140, even if the optical filter 140 is warped when the light shielding wall 150 is formed, warping of the wiring substrate 160 is not caused because of the warping of the optical filter 140.

[Forming Method for Light Shielding Wall]

Figure 3:
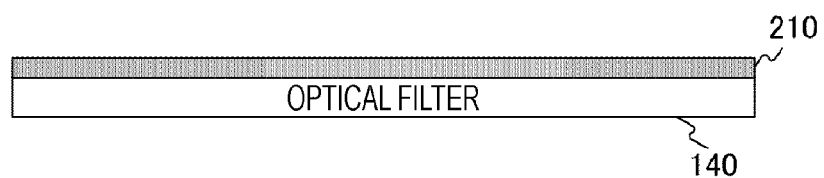
FIG. 3 is an example of cross-sectional views of an optical filter in phases until a bottom portion of a light shielding wall is formed in the first embodiment of the present technology.
Figure 3:
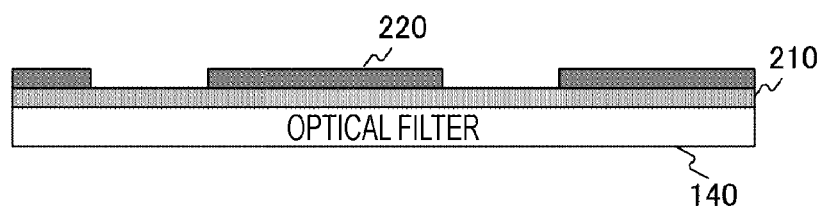
Figure 3:
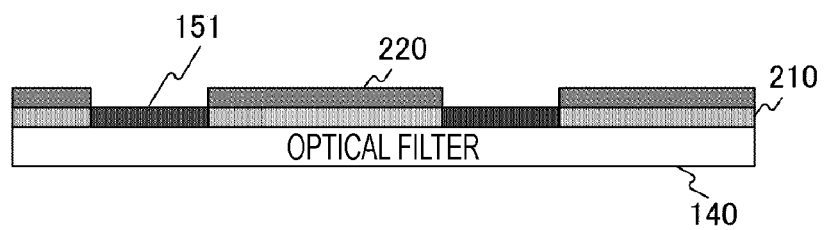
Figure 3:

FIG. 3 is an example of cross-sectional views of the optical filter 140 in phases until the bottom portion 151 of the light shielding wall 150 is formed in the first embodiment of the present technology. In FIG. 3, a is an example of a cross-sectional view of the optical filter 140 applied with an ultraviolet curable resin, and b of FIG. 3 is an example of a cross-sectional view of the optical filter 140 on which a mask is placed. Furthermore, c of FIG. 3 is an example of a cross-sectional view of the optical filter 140 exposed to an ultraviolet ray, and d of FIG. 3 is an example of a cross-sectional view of the optical filter 140 washed with a solvent.

First, as exemplified in a of FIG. 3, an ultraviolet curable resin 210 is applied onto the optical filter 140 by spin coating or the like. As the ultraviolet curable resin 210, a black ultraviolet curable resin manufactured by Kyoritsu Chemical & Co., Ltd., SEKISUI CHEMICAL CO., LTD., or Dexerials Corporation is used.

Next, as exemplified in b of FIG. 3, a mask 220 that shields light at a part of the optical filter 140 other than a part in the vicinity of the end portion of the wiring substrate 160 is placed (in other words, masked). Then, as illustrated in c of FIG. 3, exposure to an ultraviolet ray is performed to cure the unmasked part of the ultraviolet curable resin 210. Consequently, the bottom portion 151 of the light shielding wall 150 is formed. Subsequently, as exemplified in d of FIG. 3, the uncured part of the ultraviolet curable resin 210 is removed by washing with a solvent such as an alkaline aqueous solution.

Figure 4:
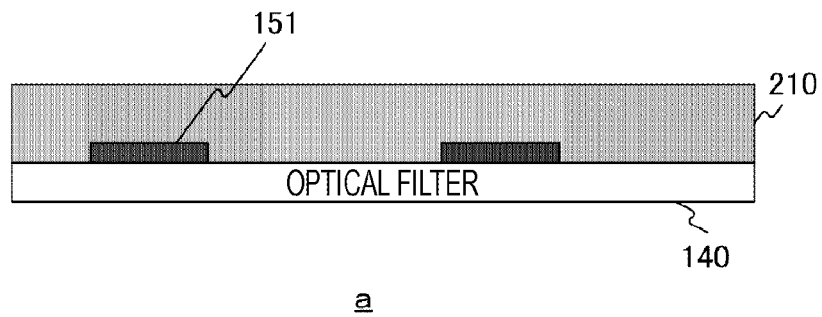
FIG. 4 is an example of cross-sectional views of the optical filter in phases until a protruding portion of the light shielding wall is formed in the first embodiment of the present technology.
Figure 4:
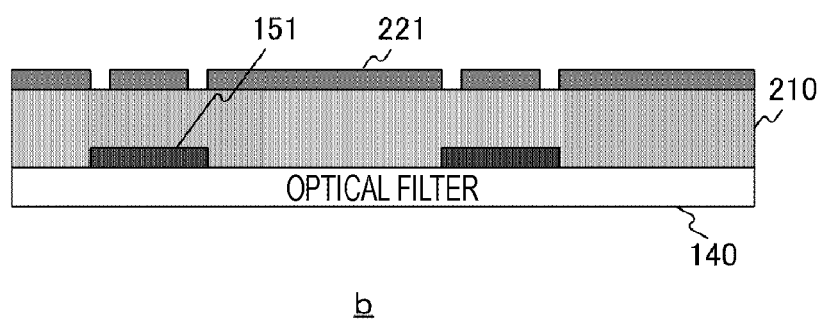
Figure 4:
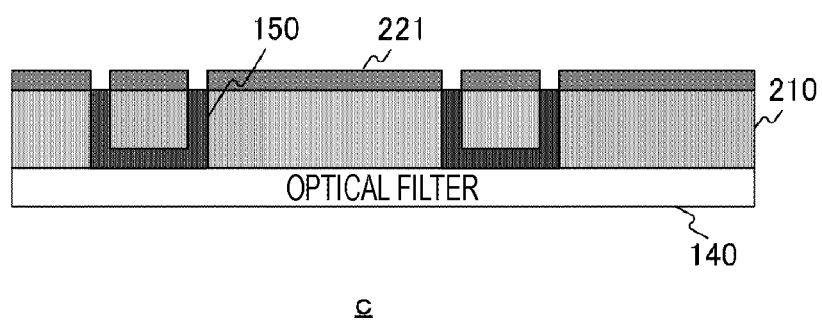
Figure 4:
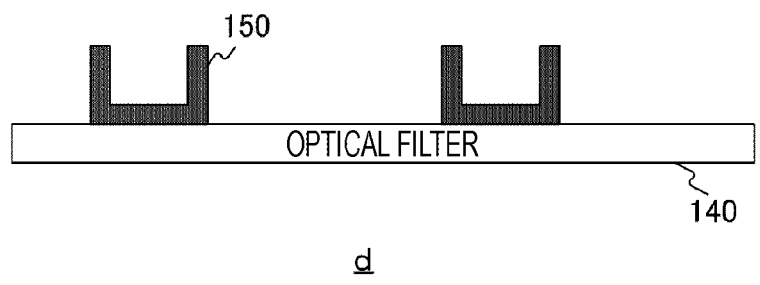

FIG. 4 is an example of cross-sectional views of the optical filter 140 in phases until the protruding portion 152 of the light shielding wall 150 is formed in the first embodiment of the present technology. In FIG. 4, a is an example of a cross-sectional view of the optical filter 140 applied with the ultraviolet curable resin again, and b of FIG. 4 is an example of a cross-sectional view of the optical filter 140 on which a mask is placed. Furthermore, c of FIG. 4 is an example of a cross-sectional view of the optical filter 140 exposed to an ultraviolet ray, and d of FIG. 4 is an example of a cross-sectional view of the optical filter 140 washed with a solvent.

After forming the bottom portion 151, the ultraviolet curable resin 210 is applied as exemplified in a of FIG. 4. Next, as exemplified in b of FIG. 4, a mask 221 that shields light at a part other than a part for forming the protruding portion 152 is placed. Then, as exemplified in c of FIG. 4, exposure to an ultraviolet ray is performed. Consequently, the protruding portion 152 of the light shielding wall 150 is formed. At this time point, since separation by dicing, which will be described later, is not performed yet, the protruding portions 152 are formed at two ends of the bottom portion 151, and the light shielding wall 150 has a cross-sectional shape of a letter "U". Subsequently, as exemplified in d of FIG. 4, the uncured part of the ultraviolet curable resin 210 is removed by washing with a solvent such as an alkaline aqueous solution.

Then, the optical filter 140 is divided into a plurality of filters by blade dicing. Consequently, the light shielding walls 150 can be simultaneously formed on the plurality of optical filters 140.

Figure 5:
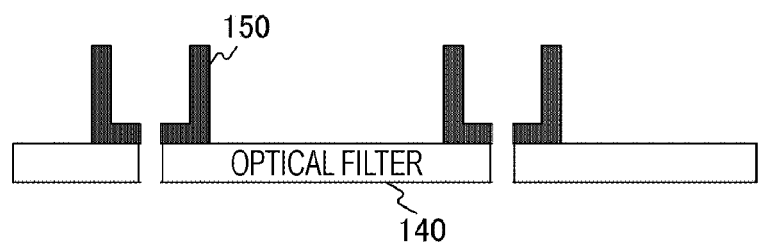
FIG. 5 is an example of a cross-sectional view of the optical filter after dicing in the first embodiment of the present technology.

FIG. 5 is an example of a cross-sectional view of the optical filter 140 after dicing in the first embodiment of the present technology.

Figure 6:
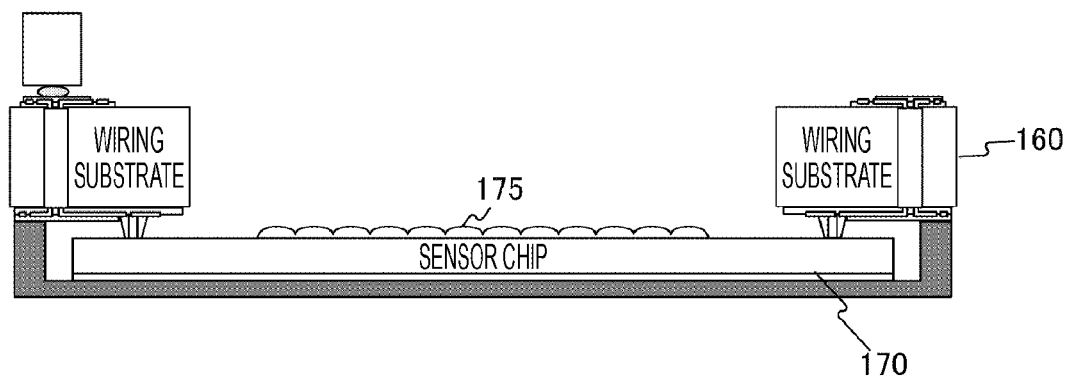
FIG. 6 is an example of cross-sectional views of the sensor chip and the wiring substrate before and after application of a temporary adhesive in the first embodiment of the present technology.
Figure 6:
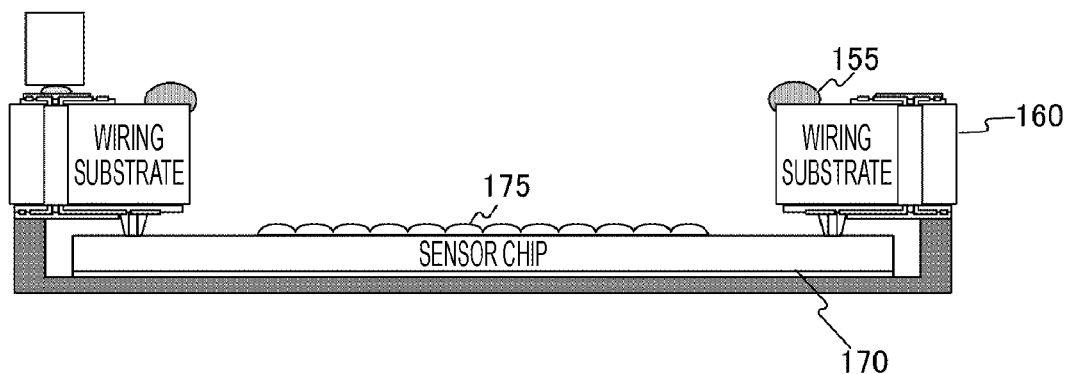

FIG. 6 is an example of cross-sectional views of the sensor chip 170 and the wiring substrate 160 before and after application of a temporary adhesive 155 in the first embodiment of the present technology. In FIG. 6, a is an example of a cross-sectional view of the sensor chip 170 and the wiring substrate 160 before the temporary adhesive 155 is applied, and b of FIG. 6 is an example of a cross-sectional view of the sensor chip 170 and the wiring substrate 160 after the temporary adhesive 155 is applied.

While the light shielding wall 150 is formed on the optical filter 140, the sensor chip 170 is flip-chip mounted on the wiring substrate 160 with a cavity as exemplified in a of FIG. 6. Thereafter, the temporary adhesive 155 is applied to an inner edge portion of the wiring substrate 160 as exemplified in b of FIG. 6. As the temporary adhesive 155, a low-tack adhesive having a lower tack than the adhesive 135 or a thermoplastic adhesive is used. As the low-tack adhesive, for example, a double-sided peelable elastic adhesive manufactured by CEMEDINE CO., LTD. can be used. As the thermoplastic adhesive, for example, STAYSTIK (registered trademark) adhesive manufactured by Techno Alpha Co., Ltd. can be used.

Figure 7:
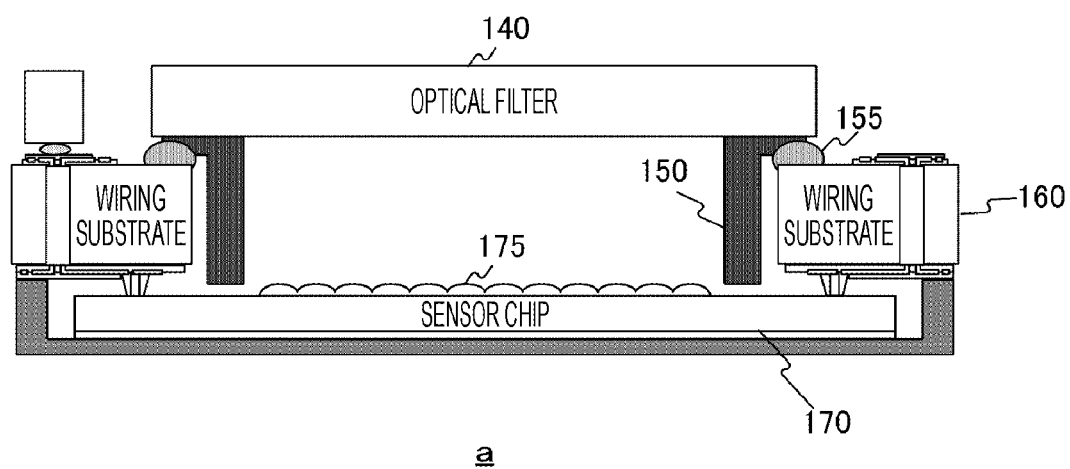
FIG. 7 is an example of cross-sectional views of the optical filter, the sensor chip, and the wiring substrate before and after application of an adhesive in the first embodiment of the present technology.
Figure 7:
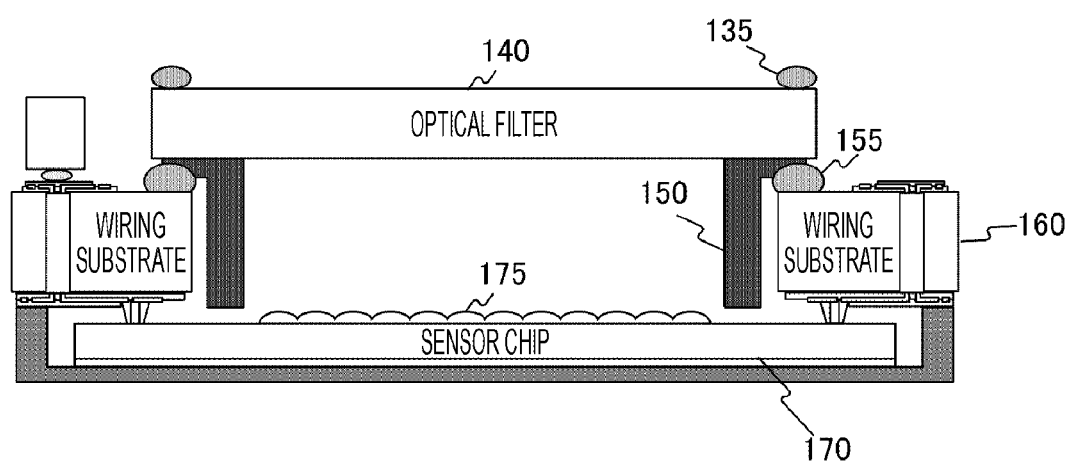

FIG. 7 is an example of cross-sectional views of the optical filter 140, the sensor chip 170, and the wiring substrate 160 before and after application of the adhesive 135 in the first embodiment of the present technology. In FIG. 7, a is an example of a cross-sectional view of the optical filter 140, the sensor chip 170 and the wiring substrate 160 before the adhesive 135 is applied, and b of FIG. 7 is an example of a cross-sectional view of the optical filter 140, the sensor chip 170 and the wiring substrate 160 after the adhesive is applied.

After applying the temporary adhesive 155, as exemplified in a of FIG. 7, the optical filter 140 on which the light shielding wall 150 has been formed is settled on the wiring substrate 160, and the temporary adhesive 155 is cured by cooling or the like. Then, as exemplified in b of FIG. 7, the adhesive 135 is applied to the outer edge portion of the light receiving side surface of the optical filter 140.

Figure 8:
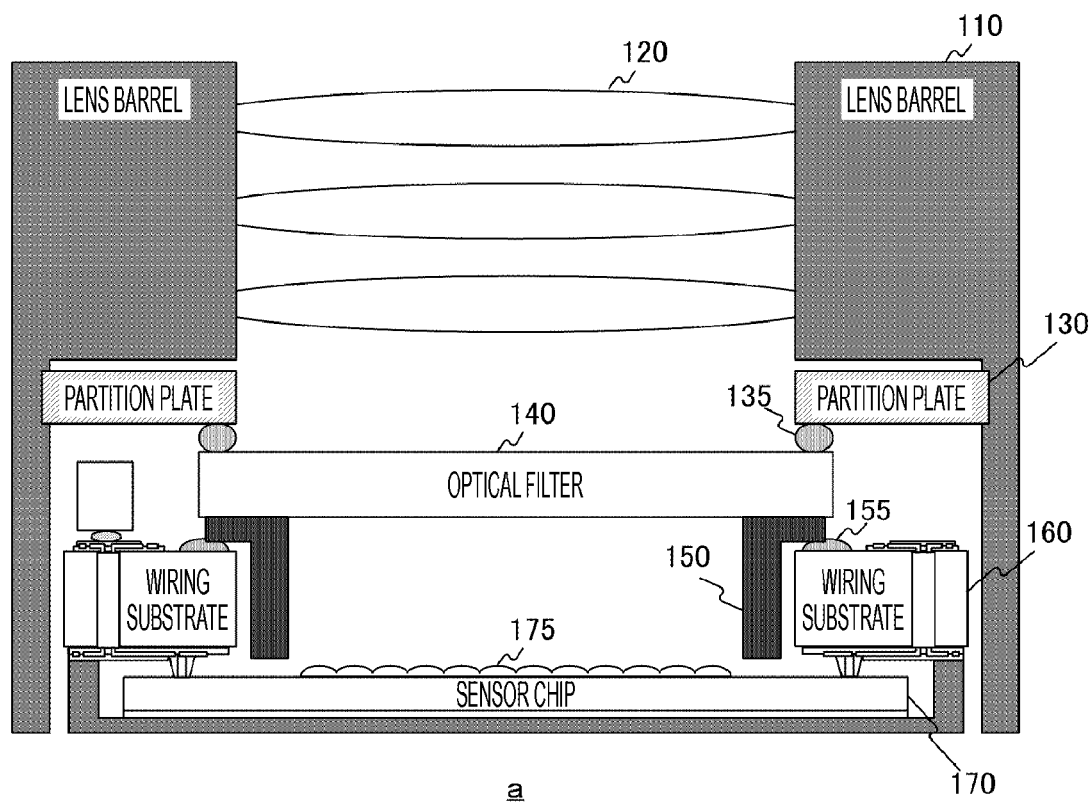
FIG. 8 is an example of cross-sectional views of the imaging apparatus before and after a lens barrel is lifted in the first embodiment of the present technology.
Figure 8:
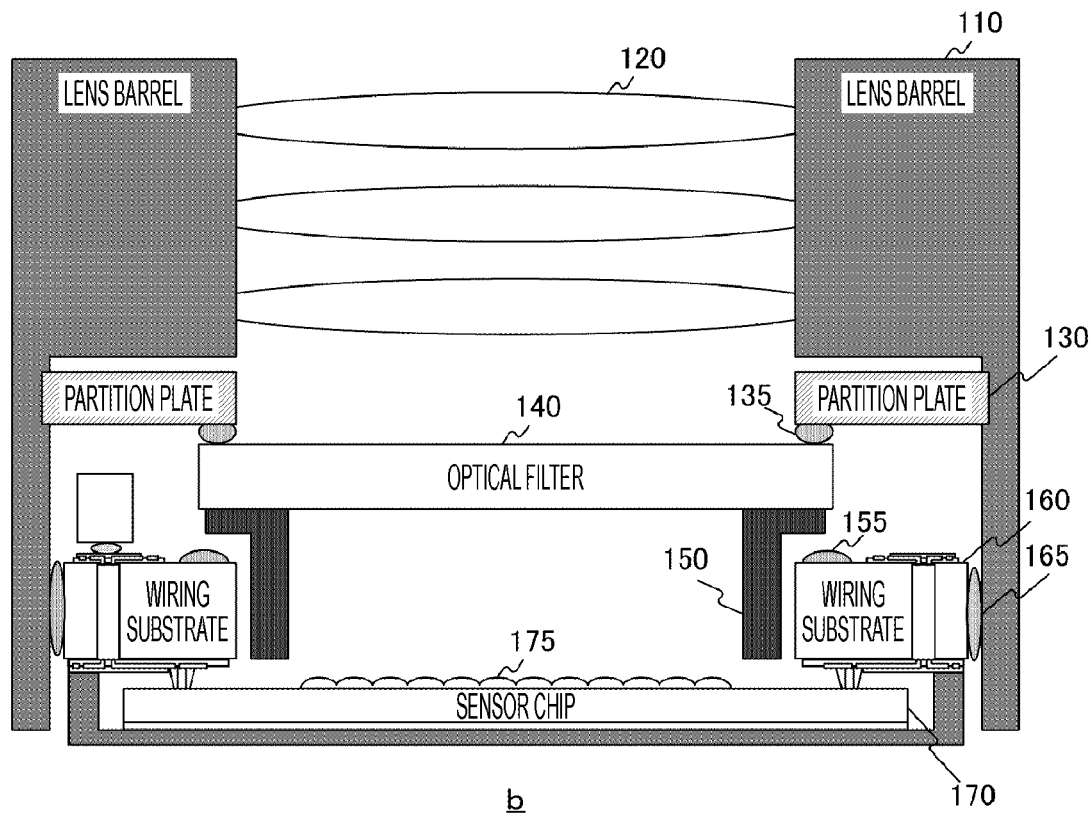

FIG. 8 is an example of cross-sectional views of the imaging apparatus 100 before and after the lens barrel 110 is lifted in the first embodiment of the present technology. In FIG. 8, a is an example of a cross-sectional view of the imaging apparatus 100 before the lens barrel 110 is lifted. In FIG. 8, b is an example of a cross-sectional view of the imaging apparatus 100 after the lens barrel 110 is lifted.

After applying the adhesive 135, as exemplified in a of FIG. 8, the lens barrel 110 on which the imaging lens 120 is mounted is settled and the partition plate 130 and the optical filter 140 are adhered to each other by the adhesive 135. Then, as exemplified in b of FIG. 8, the temporary adhesive 155 is softened by heating or the like, and the lens barrel 110 is lifted upward. Since the optical filter 140 is adhered by the adhesive 135, the optical filter 140 is also lifted together with the lens barrel 110. However, since the adhesive force of the temporary adhesive 155 is smaller than the adhesive force of the adhesive 135, the wiring substrate 160 and the sensor chip 170 that have been temporarily adhered are separated from the lens barrel 110 and the optical filter 140. Then, the inner wall of the lens barrel 110 and the side surface of the wiring substrate 160 are adhered to each other by the adhesive 165 and fixed.

Figure 9:
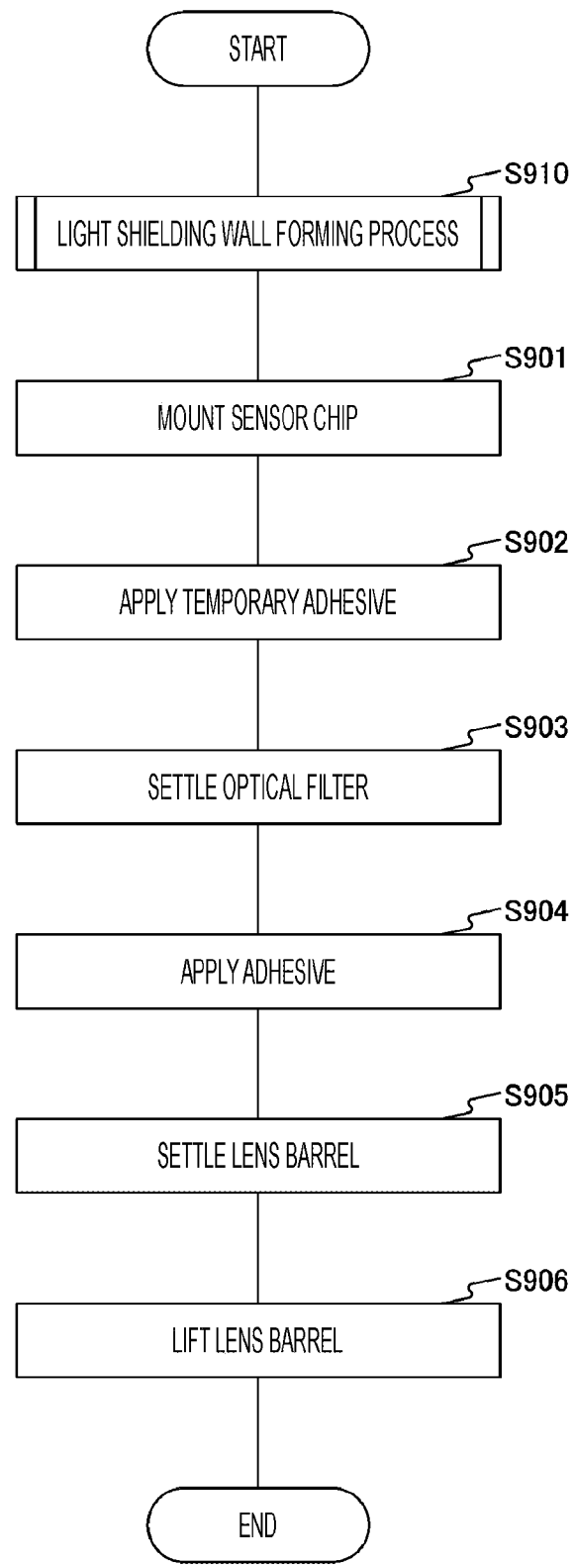
FIG. 9 is a flowchart illustrating an example of a manufacturing method for the imaging apparatus according to the first embodiment of the present technology.

FIG. 9 is a flowchart illustrating an example of a manufacturing method for the imaging apparatus 100 according to the first embodiment of the present technology. First, a manufacturing system that manufactures the imaging apparatus 100 performs a light shielding wall forming process for forming the light shielding wall 150 on the optical filter 140 (step S910). Then, the manufacturing system carries out flip-chip mounting of the sensor chip 170 on the wiring substrate 160 (step S901). Thereafter, the manufacturing system applies the temporary adhesive 155 to the inner edge portion of the wiring substrate 160 (step S902).

Then, the manufacturing system settles the optical filter 140 on which the light shielding wall 150 has been formed on the wiring substrate 160 to cure the temporary adhesive 155 (step S903), and applies the adhesive 135 to the outer edge portion of the light receiving side surface of the optical filter 140 (step S904). Subsequently, the manufacturing system settles the lens barrel 110 to adhere the partition plate 130 and the optical filter 140 to each other with the adhesive 135 (step S905), and lifts the lens barrel 110 together with the optical filter 140 (step S906). After step S906, the manufacturing system executes a variety of remaining phases and ends the manufacturing phase for the imaging apparatus 100.

Figure 10:
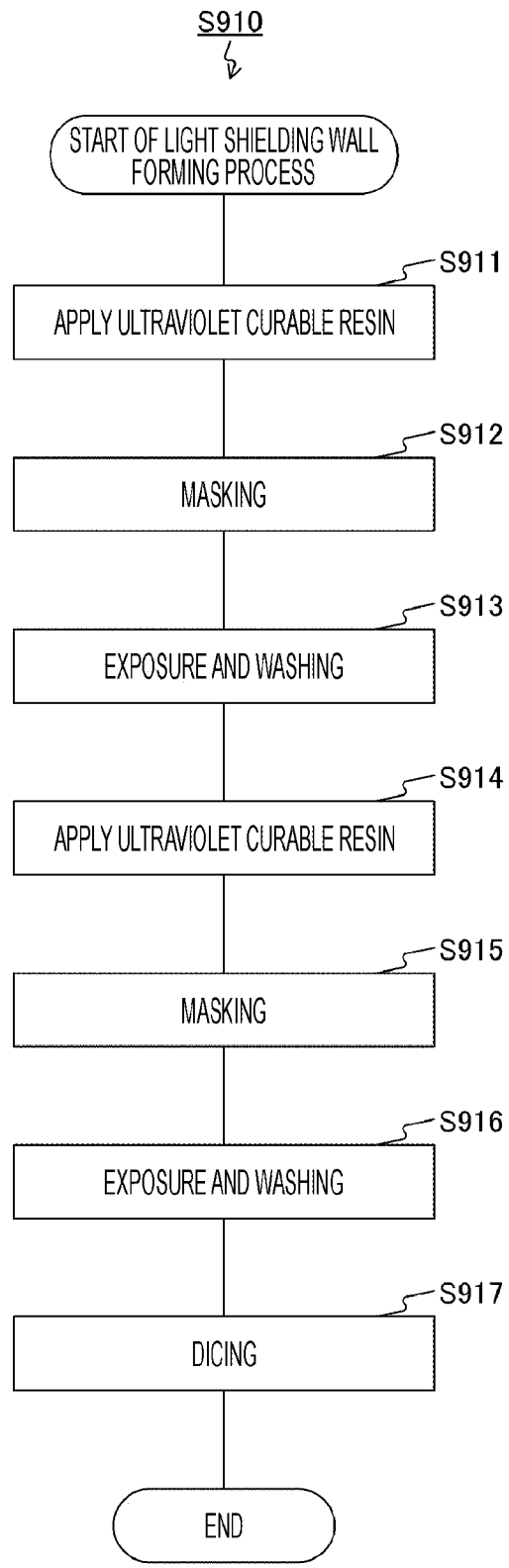
FIG. 10 is a flowchart illustrating an example of a light shielding wall forming process according to the first embodiment of the present technology.

FIG. 10 is a flowchart illustrating an example of the light shielding wall forming process according to the first embodiment of the present technology. The manufacturing system applies the ultraviolet curable resin 210 onto the optical filter 140 by spin coating or the like (step S911), and masks the optical filter 140 except for the vicinity of the end portion of the wiring substrate 160 (step S912). Then, the manufacturing system performs exposure to an ultraviolet ray and washing with a solvent such as an alkaline aqueous solution (step S913).

Subsequently, the manufacturing system applies the ultraviolet curable resin 210 (step S914), and masks a part other than a part for forming the protruding portion 152 (step S915). Then, the manufacturing system performs exposure to an ultraviolet ray and washing with a solvent such as an alkaline aqueous solution (step S916). Then, the manufacturing system performs dicing on the optical filter 140 (step S917). After step S917, the manufacturing system ends the light shielding wall forming process.

As described above, in the first embodiment of the present technology, since the light shielding wall 150 is formed on the optical filter 140, it is possible to prevent warping of the sensor chip 170 from occurring because of the processing at the time of forming the optical filter 140. Consequently, it is possible to suppress the degradation of image quality of image data due to warping of the sensor chip 170.

2. Second Embodiment

In the first embodiment described above, a gap is provided between the light shielding wall 150 and the wiring substrate 160; however, there is a possibility that dust is mixed via this gap and sticks to the image plane of the sensor chip 170. This second embodiment is different from the first embodiment in that the gap between a light shielding wall 150 and a wiring substrate 160 is eliminated.

Figure 11:
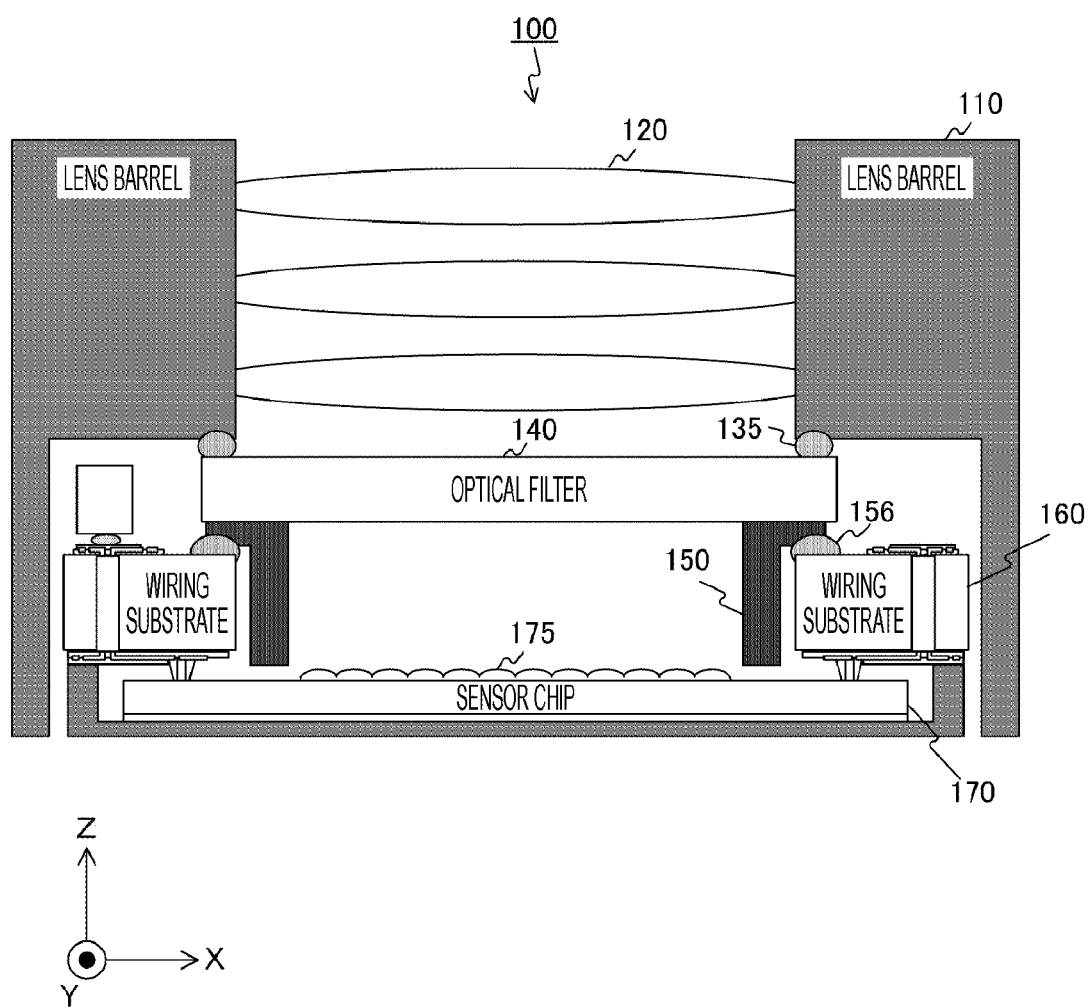
FIG. 11 is an example of a cross-sectional view of an imaging apparatus according to a second embodiment of the present technology.

FIG. 11 is an example of a cross-sectional view of an imaging apparatus 100 according to the second embodiment of the present technology. This imaging apparatus 100 according to the second embodiment is different from the imaging apparatus 100 according to the first embodiment in that a partition plate 130 is not provided, and the light receiving surface side of an optical filter 140 is adhered to the inner wall of a lens barrel 110 by an adhesive 135. Furthermore, the second embodiment is different from the first embodiment in that a flexible material 156 is filled between the light shielding wall 150 and the wiring substrate 160. For example, an elastomer is used as the flexible material 156. As the elastomer, for example, room temperature vulcanizing (RTV) silicone rubber manufactured by Shin-Etsu Chemical Co., Ltd. can be used. By filling the flexible material 156, the gap between the light shielding wall 150 and the wiring substrate 160 is eliminated, and a sensor chip 170 can be sealed. Furthermore, in the second embodiment, the side surface of the wiring substrate 160 is not adhered to the lens barrel 110.

Figure 12:
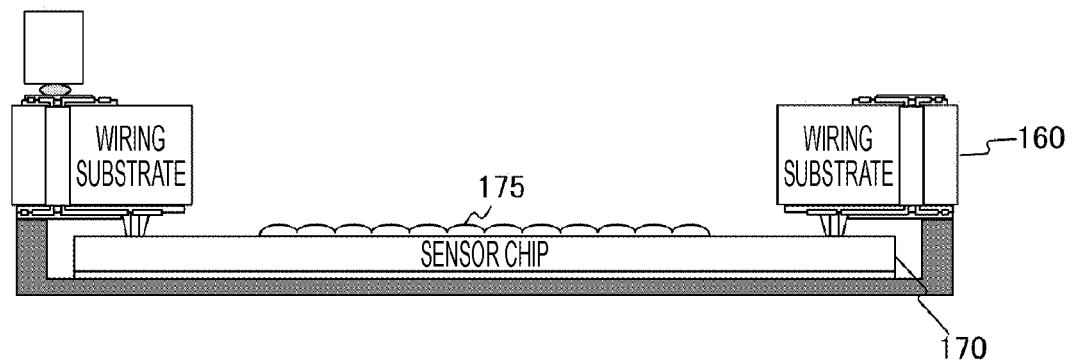
FIG. 12 is an example of cross-sectional views of a sensor chip and a wiring substrate before and after application of a flexible material in the second embodiment of the present technology.
Figure 12:
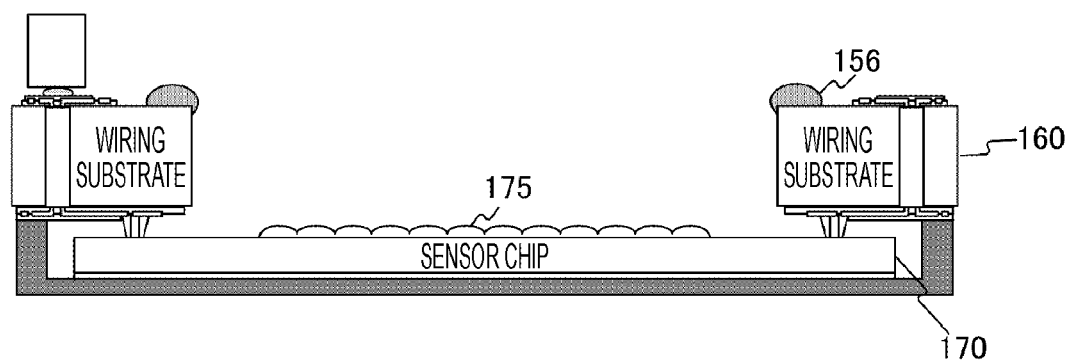

FIG. 12 is an example of cross-sectional views of the sensor chip 170 and the wiring substrate 160 before and after application of the flexible material 156 in the second embodiment of the present technology. In FIG. 12, a is an example of a cross-sectional view of the sensor chip 170 and the wiring substrate 160 before the flexible material 156 is applied, and b of FIG. 12 is an example of a cross-sectional view of the sensor chip 170 and the wiring substrate 160 after the flexible material 156 is applied.

The sensor chip 170 is flip-chip mounted on the wiring substrate 160 with a cavity as exemplified in a of FIG. 12. Thereafter, the flexible material 156 is applied to an inner edge portion of the wiring substrate 160 as exemplified in b of FIG. 12.

Figure 13:
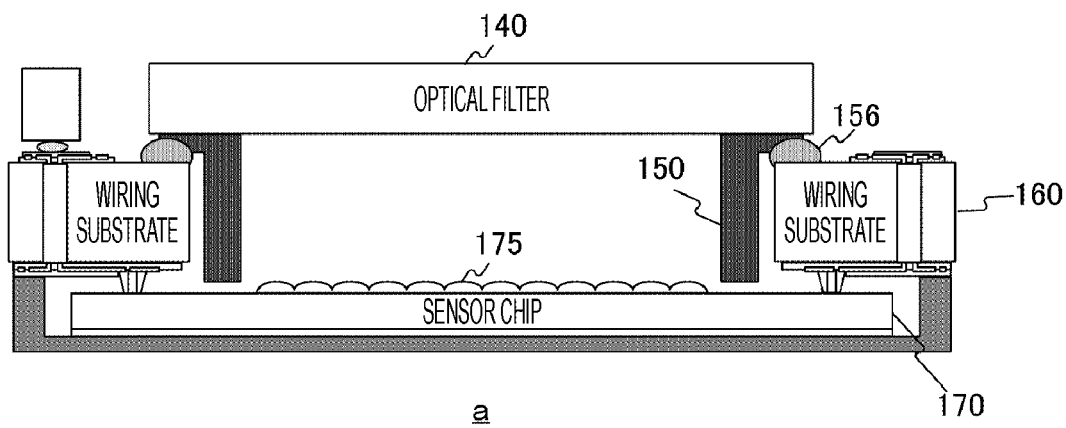
FIG. 13 is an example of cross-sectional views of the sensor chip and the wiring substrate before and after application of an adhesive in the second embodiment of the present technology.
Figure 13:
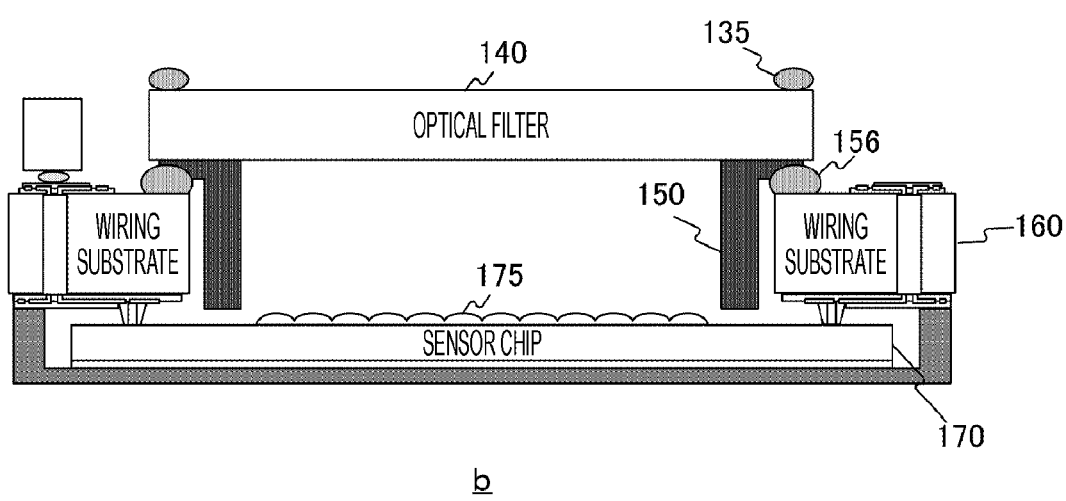

FIG. 13 is an example of cross-sectional views of the optical filter 140, the sensor chip 170, and the wiring substrate 160 before and after application of the adhesive 135 in the second embodiment of the present technology. In FIG. 13, a is an example of a cross-sectional view of the optical filter 140, the sensor chip 170, and the wiring substrate 160 before application of the adhesive 135. In FIG. 13, b is an example of a cross-sectional view of the optical filter 140, the sensor chip 170, and the wiring substrate 160 after application of the adhesive material 135.

After applying the flexible material 156, as exemplified in a of FIG. 13, the optical filter 140 on which the light shielding wall 150 has been formed is settled on the wiring substrate 160, and the flexible material 156 is cured by heat treatment or ultraviolet irradiation. Then, as exemplified in b of FIG. 13, the adhesive material 135 is applied to the light receiving side surface of the optical filter 140. Thereafter, the lens barrel 110 is settled, the optical filter 140 and the lens barrel 110 are adhered to each other by the adhesive material 135, and the adhesive material 135 is cured by heat treatment or the like. Consequently, the imaging apparatus 100 exemplified in FIG. 11 is obtained.

Figure 14:
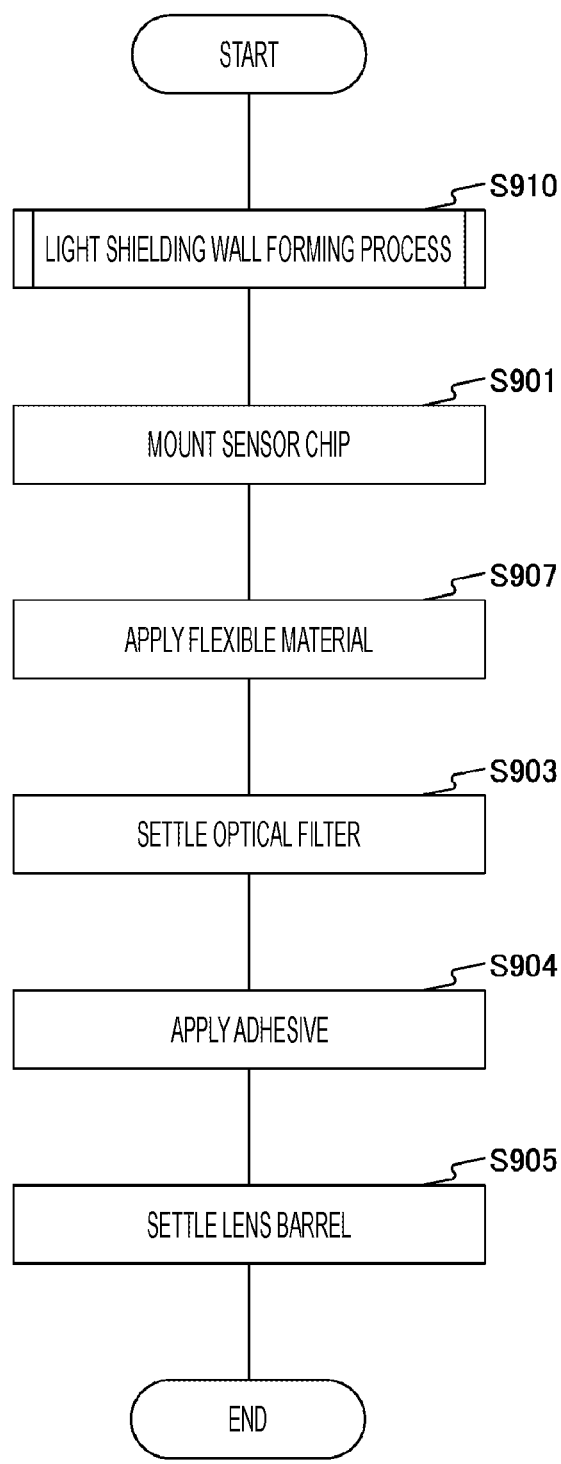
FIG. 14 is a flowchart illustrating an example of a manufacturing method for the imaging apparatus according to the second embodiment of the present technology.

FIG. 14 is a flowchart illustrating an example of a manufacturing method for the imaging apparatus 100 according to the second embodiment of the present technology. The manufacturing method according to the second embodiment is different from the manufacturing method according to the first embodiment in that step S907 is executed instead of step S902.

A manufacturing system forms the light shielding wall 150 on the optical filter 140 (step S910), and carries out flip-chip mounting of the sensor chip 170 on the wiring substrate 160 (step S901). Thereafter, the manufacturing system applies the flexible material 156 to the inner edge portion of the wiring substrate 160 (step S907). Then, the manufacturing system executes step S903 and subsequent steps.

As described above, in the second embodiment of the present technology, since the flexible material 156 is filled between the light shielding wall 150 and the wiring substrate 160, the gap between the light shielding wall 150 and the wiring substrate 160 can be eliminated. Consequently, dust can be prevented from being mixed through the gap.

3. Third Embodiment

In the first embodiment described above, the light shielding wall 150 is formed by the ultraviolet curable resin 210; however, the ultraviolet curable resin 210 has a disadvantage that it is not suitable for forming a complicated shape due to the straightness of light. For example, in the first embodiment, ultraviolet light exposure and washing are required both when the bottom portion 151 of the light shielding wall 150 is formed and when the protruding portion 152 of the light shielding wall 150 is formed. Furthermore, as compared with the thermosetting resin, there are disadvantages that the strength is low and a unit price is high. For example, if the thermosetting resin is used, those disadvantages can be resolved. An imaging apparatus 100 according to this third embodiment is different from the imaging apparatus 100 according to the first embodiment in that a light shielding wall 150 is formed by a thermosetting resin.

Figure 15:
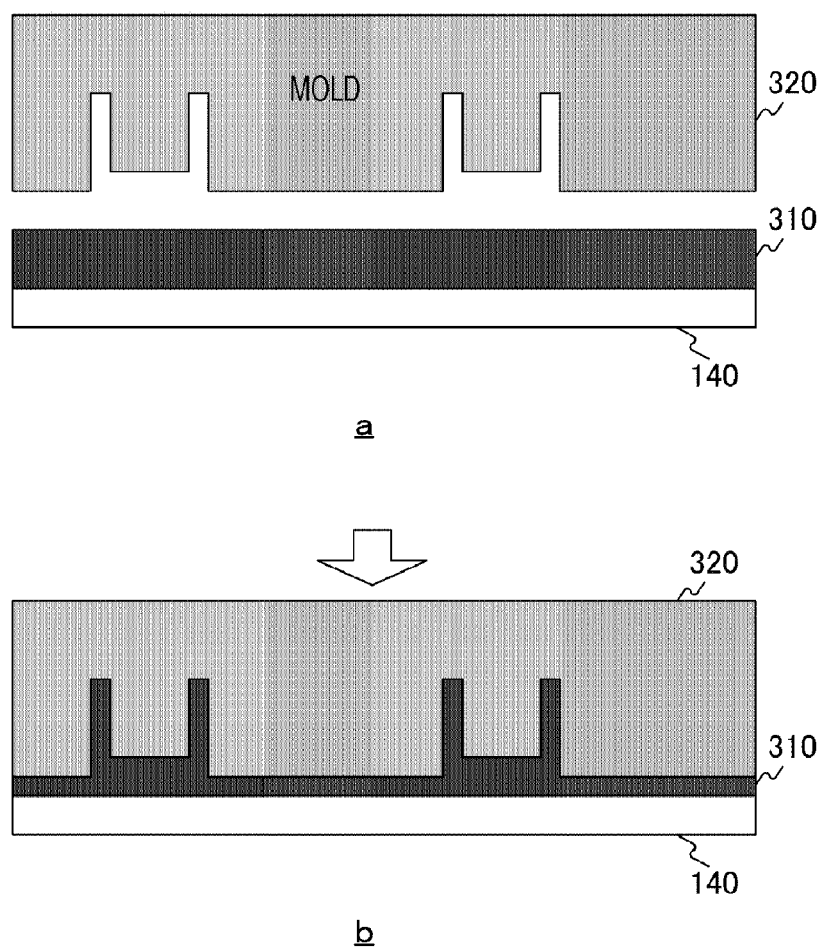
FIG. 15 is an example of cross-sectional views of an optical filter before and after patterning in a third embodiment of the present technology.

FIG. 15 is an example of cross-sectional views of an optical filter 140 before and after patterning in the third embodiment of the present technology. In FIG. 15, a is an example of a cross-sectional view of the optical filter 140 before patterning, and b of FIG. 15 is an example of a cross-sectional view of the optical filter 140 after patterning.

First, as exemplified in a of FIG. 15, a thermosetting resin 310 is applied onto the optical filter 140. As the thermosetting resin 310, an epoxy thermosetting resin or the like can be used. Then, for example, a mold 320 of which the cross-sectional shape is a predetermined shape such as a U-shape is prepared.

Then, as exemplified in b of FIG. 15, the mold 320 is pressed from above the thermosetting resin 310 to be cured by heating. Consequently, the shape of the mold 320 is formed (patterned) in the thermosetting resin 310. In heating, the curing temperature is, for example, 140 to 160 degrees (° C.).

Figure 16:
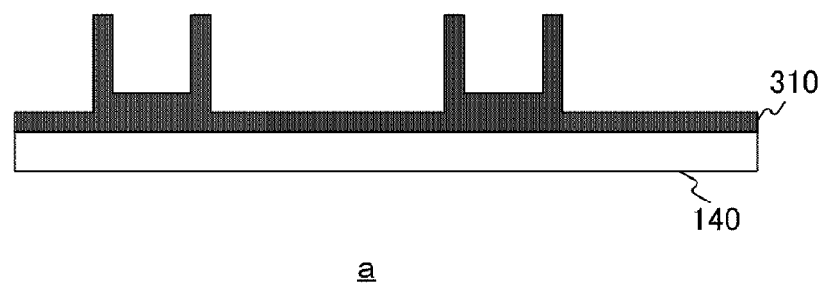
FIG. 16 is an example of cross-sectional views of the optical filter until a dicing phase in the third embodiment of the present technology.
Figure 16:
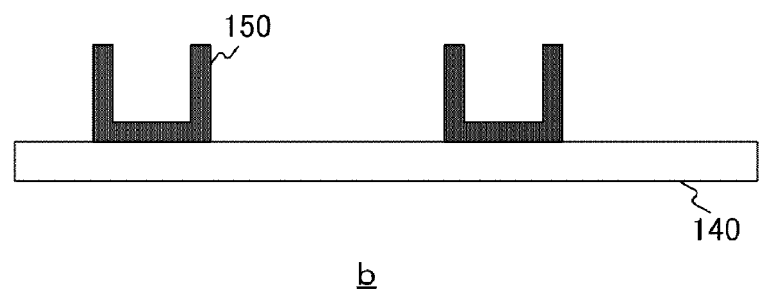
Figure 16:
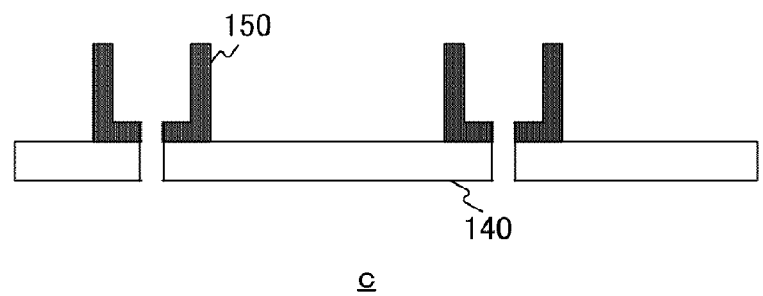

FIG. 16 is an example of cross-sectional views of the optical filter 140 until a dicing phase in the third embodiment of the present technology. In FIG. 16, a is an example of a cross-sectional view of the optical filter 140 from which the mold 320 has been peeled off. In FIG. 16, b is an example of a cross-sectional view of the optical filter 140 after etching, and c of FIG. 16 is an example of a cross-sectional view of the optical filter 140 after dicing.

The mold 320 is peeled off after patterning as exemplified in a of FIG. 16. Then, if an unnecessary part other than the U-shape remains, the unnecessary part is removed by etching, as exemplified in b of FIG. 16. Consequently, the light shielding wall 150 is formed. Etching is performed according to the residual film thickness by dry etching or wet etching. In dry etching, oxygen plasma or the like is used as an etching gas. In wet etching, sulfuric acid hydrogen peroxide mixture (SPM) or the like is used as an etching solution. Thereafter, as exemplified in c of FIG. 16, the optical filter 140 is divided into a plurality of filters by blade dicing.

Figure 17:
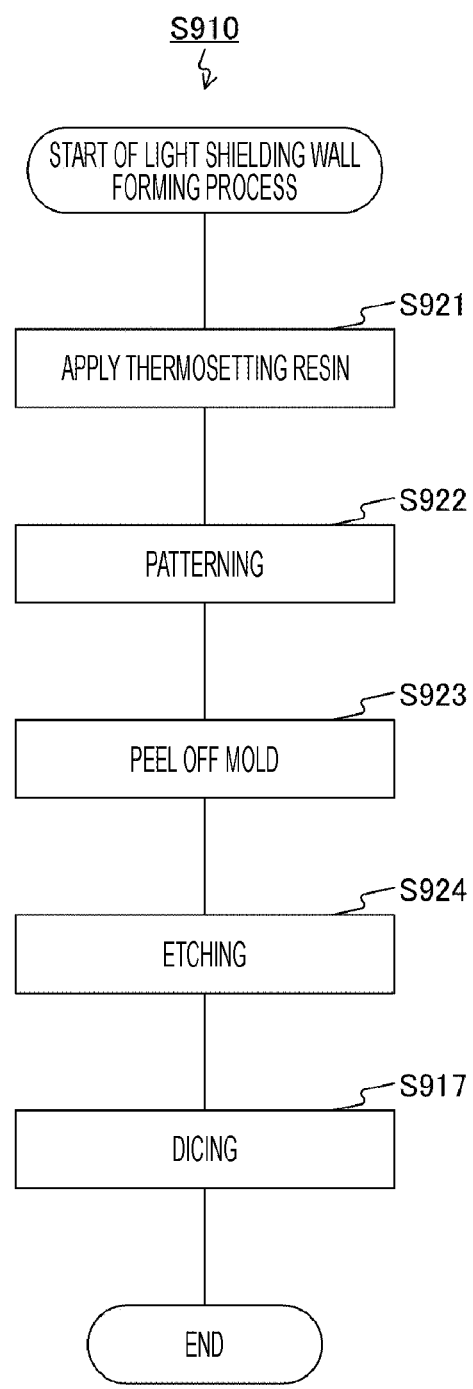
FIG. 17 is a flowchart illustrating an example of a light shielding wall forming process according to the third embodiment of the present technology.

FIG. 17 is a flowchart illustrating an example of a light shielding wall forming process according to the third embodiment of the present technology. A manufacturing system applies the thermosetting resin 310 onto the optical filter 140 (step S921), and performs patterning using the mold 320 (step S922). The manufacturing system peels off the mold 320 (step S923), and removes an unnecessary part by etching (step S924). Then, the manufacturing system performs dicing on the optical filter 140 (step S917). After step S917, the manufacturing system ends the light shielding wall forming process.

As described above, in the third embodiment of the present technology, the light shielding wall 150 is formed by patterning the thermosetting resin 310 using the mold, such that the light shielding wall 150 having a complicated shape can be easily formed.

4. Fourth Embodiment

In the first embodiment described above, a gap is provided between the L-shaped light shielding wall 150 and the wiring substrate 160. However, if an impact is given to the imaging apparatus 100 and acceleration is produced in a direction perpendicular to the Z axis, there is a possibility that the optical filter 140 moves in that direction, and the protruding portion 152 of the light shielding wall 150 collides with the side surface of the wiring substrate 160. Consequently, there is a possibility that debris is produced and the debris sticks to the image plane of the sensor chip 170. An imaging apparatus 100 according to this fourth embodiment is different from the imaging apparatus 100 according to the first embodiment in that the movement of an optical filter 140 in a direction perpendicular to the Z axis is restricted.

Figure 18:
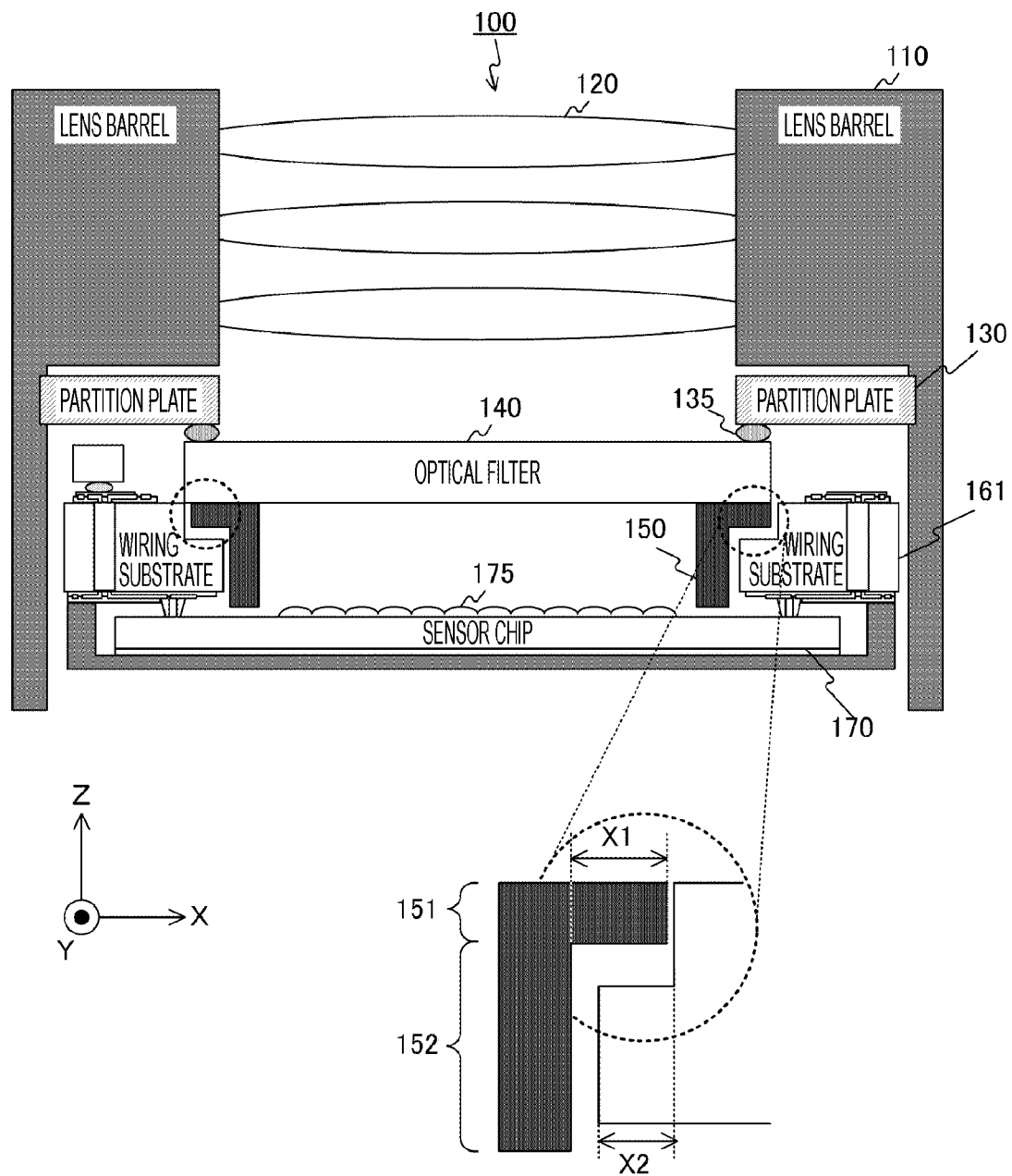
FIG. 18 is an example of a cross-sectional view of an imaging apparatus according to a fourth embodiment of the present technology.

FIG. 18 is an example of a cross-sectional view of the imaging apparatus 100 according to the fourth embodiment of the present technology. This imaging apparatus 100 according to the fourth embodiment is different from the imaging apparatus 100 according to the first embodiment in that a wiring substrate 161 provided with a step at an inner edge portion is placed instead of the wiring substrate 160. This step is provided on an inner edge portion of a surface of the wiring substrate 160 on the side of the optical filter 140, out of two surfaces of the wiring substrate 160. Furthermore, in the fourth embodiment, the side surface of the wiring substrate 160 is not adhered to a lens barrel 110.

The size of a part of the bottom portion 151 of the light shielding wall 150 projecting in the X direction is defined to be X1. Furthermore, the size of the step in the X direction is defined to be X2. A value smaller than X1 is set for X2. As described above, since the size of the bottom portion 151 is larger than the size of the step in the X direction, the movement of the optical filter 140 in the X direction is restricted. In addition, the movement of the optical filter 140 in the Y direction is similarly restricted by the step. Consequently, even if acceleration is produced in the X direction or the Y direction, the side surface of the protruding portion 152 of the light shielding wall 150 does not collide with the side surface of the wiring substrate 160. Besides, since the movement in the X direction and the Y direction is restricted by the step, positioning when settling the optical filter 140 is facilitated.

As described above, in the fourth embodiment of the present technology, since the wiring substrate 160 is provided with the step that restricts the movement of the optical filter 140 in the X direction and the Y direction, a collision between the side surface of the protruding portion 152 of the light shielding wall 150 and the side surface of the wiring substrate 160 can be prevented.

5. Application Example to Endoscopic Surgery System

The technology according to the present disclosure (present technology) can be applied to a variety of products. For example, the technology according to the present disclosure may be applied to an endoscopic surgery system.

Figure 19:
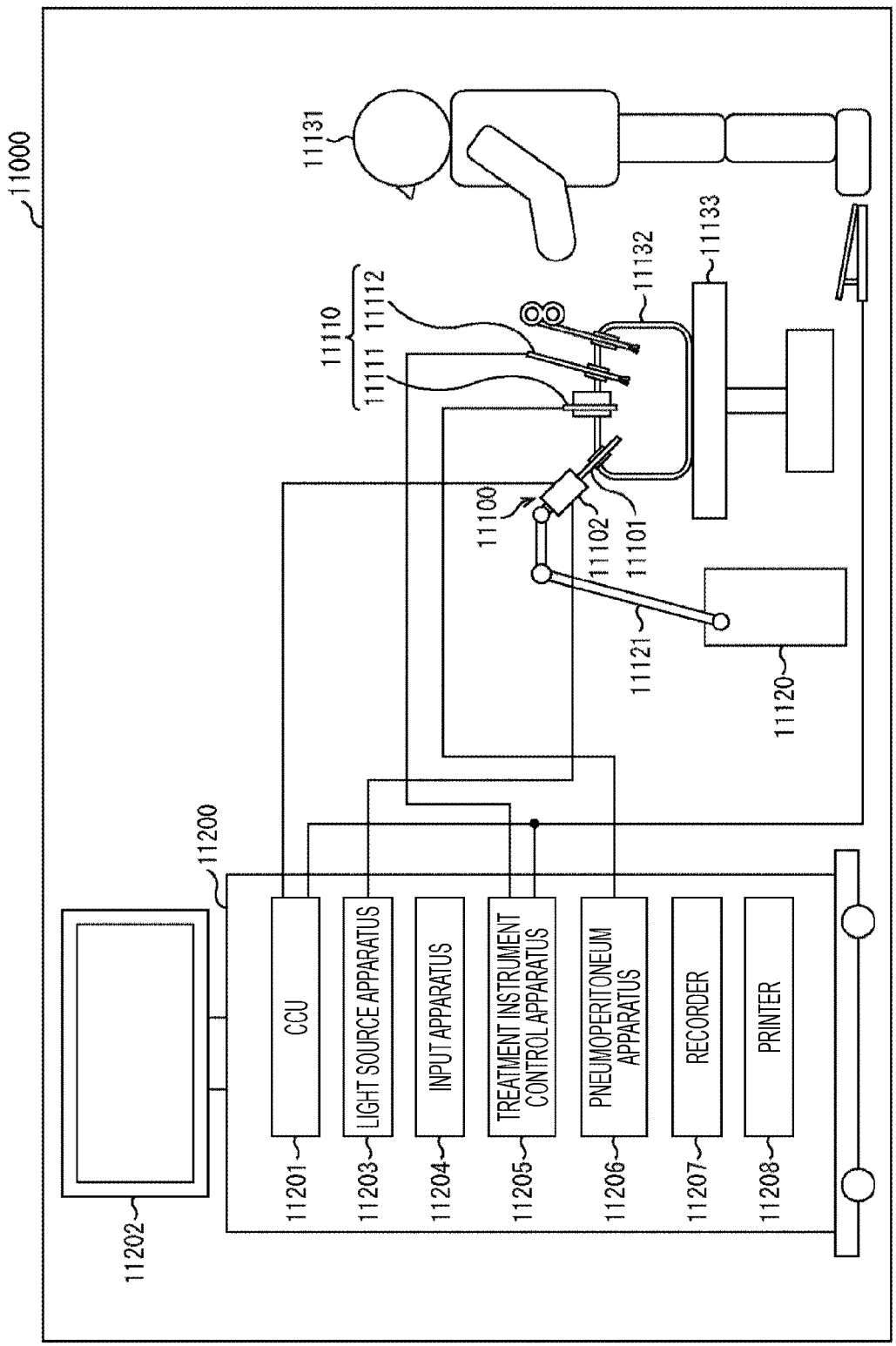
FIG. 19 is a diagram illustrating an example of a schematic configuration of an endoscopic surgery system.

FIG. 19 is a diagram illustrating an example of a schematic configuration of an endoscopic surgery system to which the technology according to the present disclosure (present technology) can be applied.

FIG. 19 illustrates a scene in which an operating surgeon (surgeon) 11131 is performing a surgery on a patient 11132 on a patient bed 11133 using an endoscopic surgery system 11000. As illustrated in FIG. 19, the endoscopic surgery system 11000 is constituted by an endoscope 11100, other surgical tools 11110 such as a pneumoperitoneum tube 11111 and an energy treatment instrument 11112, a support arm apparatus 11120 supporting the endoscope 11100, and a cart 11200 in which various apparatuses for surgery through the endoscope are equipped.

The endoscope 11100 is constituted by the lens barrel 11101 of which a region of a predetermined length from the distal end is inserted into the body cavity of the patient 11132, and a camera head 11102 connected to the proximal end of the lens barrel 11101. In the illustrated example, the endoscope 11100 configured as a so-called rigid endoscope having the rigid lens barrel 11101 is illustrated; however, the endoscope 11100 may be configured as a so-called flexible endoscope having the flexible lens barrel.

An opening portion into which an objective lens is fitted is provided at the distal end of the lens barrel 11101. A light source apparatus 11203 is connected to the endoscope 11100; light generated by this light source apparatus 11203 is guided to the distal end of the lens barrel 11101 by a light guide provided extending inside this lens barrel, and is radiated toward an object to be observed in the body cavity of the patient 11132 via the objective lens. Note that the endoscope 11100 may be a forward-viewing endoscope, an oblique-viewing endoscope, or a side-viewing endoscope.

An optical system and an imaging element are provided inside the camera head 11102 and reflected light (observation light) from the object to be observed is converged on this imaging element by this optical system. The observation light is photoelectrically converted by the imaging element and an electrical signal corresponding to the observation light, in other words, an image signal corresponding to the observation image is generated. This image signal is transmitted as RAW data to a camera control unit (CCU) 11201.

The CCU 11201 is constituted by a central processing unit (CPU), graphics processing unit (GPU), or the like and comprehensively controls working of the endoscope 11100 and the display apparatus 11202. Moreover, the CCU 11201 accepts the image signal from the camera head 11102, and carries out various image processes for displaying an image based on the image signal, such as a developing process (demosaic process), for example, on the accepted image signal.

The display apparatus 11202 displays an image based on the image signal on which the image processes have been carried out by the CCU 11201, under the control of the CCU 11201.

The light source apparatus 11203 is constituted, for example, by a light source such as a light emitting diode (LED) and supplies irradiation light used when the surgical site or the like is captured to the endoscope 11100.

The input apparatus 11204 is an input interface to the endoscopic surgery system 11000. The user can input various types of information and input instructions to the endoscopic surgery system 11000 via the input apparatus 11204. For example, the user inputs an instruction or the like to change the imaging conditions (type of irradiation light, magnification, focal length, and the like) for the endoscope 11100.

A treatment instrument control apparatus 11205 controls driving of the energy treatment instrument 11112 for cauterization and incision of tissue, sealing of a blood vessel, or the like. For the purpose of securing a visual field through the endoscope 11100 and securing a working space for the operating surgeon, a pneumoperitoneum apparatus 11206 delivers a gas into the body cavity of the patient 11132 via the pneumoperitoneum tube 11111 in order to inflate the body cavity. A recorder 11207 is an apparatus capable of recording various types of information regarding surgery. A printer 11208 is an apparatus capable of printing various types of information regarding surgery in various formats such as text, image, or graph.

Note that the light source apparatus 11203 that supplies irradiation light used when the surgical site is captured to the endoscope 11100 can be constituted by, for example, a white light source configured by an LED, a laser light source, or a combination thereof. In a case where the white light source is constituted by a combination of RGB laser light sources, the output intensity and the output timing of each color (each wavelength) can be controlled with high precision and accordingly the white balance of the captured image can be adjusted in the light source apparatus 11203. Furthermore, in this case, by irradiating an object to be observed with a laser beam from each of the RGB laser light sources by time sharing and controlling driving of the imaging element of the camera head 11102 in synchronization with the irradiation timing, it is also possible to capture an image corresponding to each of RGB by time sharing. According to this method, a color image can be obtained without providing a color filter in the imaging element.

In addition, driving of the light source apparatus 11203 may be controlled such that the intensity of light to be output is changed for every predetermined time span. By controlling driving of the imaging element of the camera head 11102 in synchronization with the timing of the change of the intensity of light to acquire images by time sharing and merging these images, an image of a high dynamic range without so-called blocked up shadows and blown out highlights can be generated.

Furthermore, the light source apparatus 11203 may be configured such that light of a predetermined wavelength band compatible with special light observation can be supplied from the light source apparatus 11203. In the special light observation, for example, by utilizing the wavelength dependence of light absorption in body tissue, so-called narrow band light observation (narrow band imaging) is performed in which, by radiating narrow band light compared with the irradiation light at the time of ordinary observation (in other words, white light), predetermined tissue such as a blood vessel at a mucosal surface layer is captured with high contrast. Alternatively, in the special light observation, fluorescence observation for obtaining an image by fluorescence produced by radiating excitation light may be performed. In the fluorescence observation, for example, observation in which body tissue is irradiated with excitation light and fluorescence from the body tissue is observed (autofluorescence observation), or observation in which a reagent such as indocyanine green (ICG) is locally administered to body tissue and at the same time, the body tissue is irradiated with excitation light corresponding to a fluorescence wavelength of the reagent to obtain a fluorescent image can be performed. The light source apparatus 11203 can be configured such that narrow band light and/or excitation light compatible with such special light observation can be supplied from the light source apparatus 11203.

Figure 20:
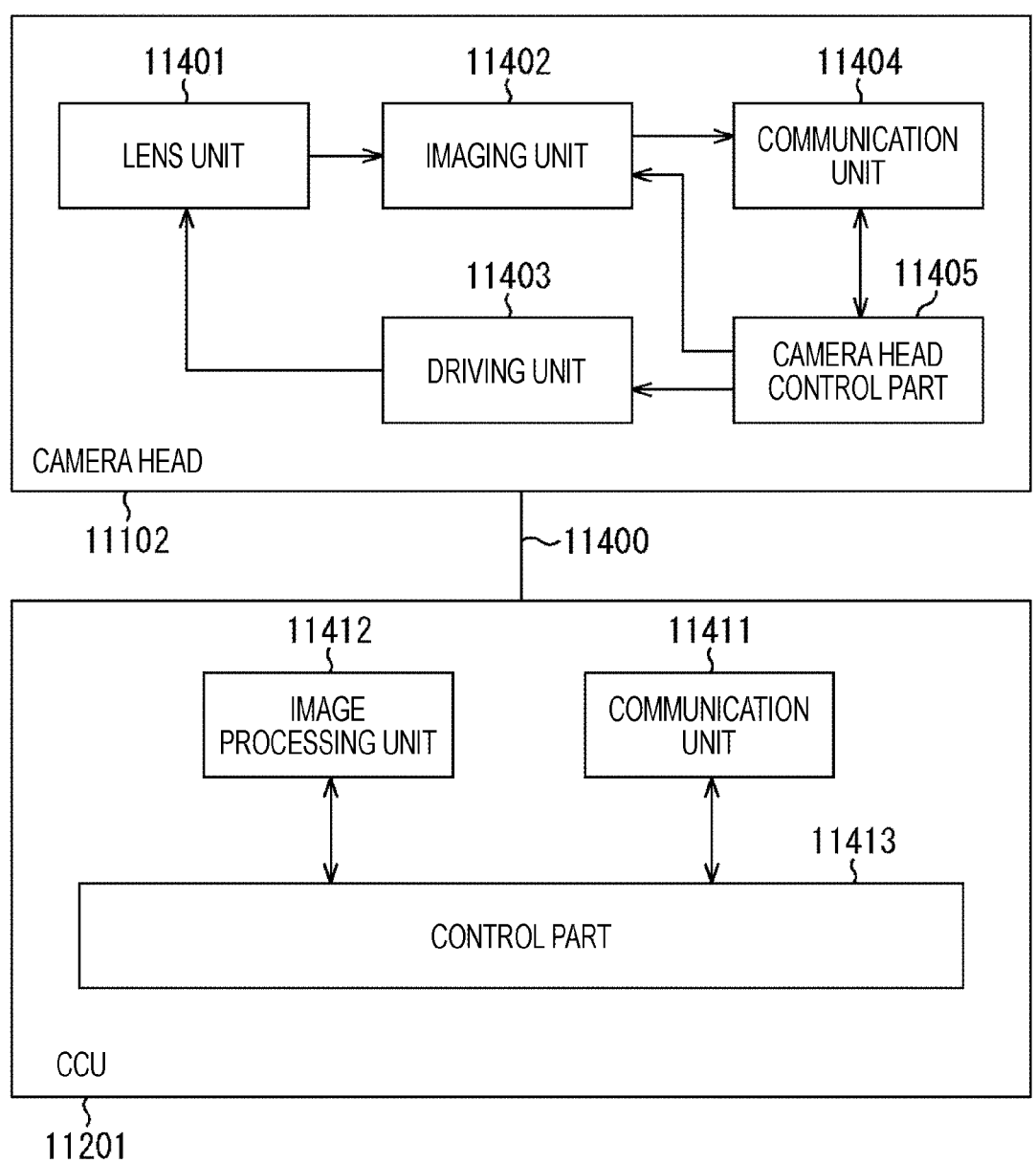
FIG. 20 is a block diagram illustrating an example of functional configurations of a camera head and a camera control unit (CCU).

FIG. 20 is a block diagram illustrating an example of functional configurations of the camera head 11102 and the CCU 11201 illustrated in FIG. 19.

The camera head 11102 includes a lens unit 11401, an imaging unit 11402, a driving unit 11403, a communication unit 11404, and a camera head control part 11405. The CCU 11201 has a communication unit 11411, an image processing unit 11412, and a control part 11413. The camera head 11102 and the CCU 11201 are connected via a transmission cable 11400 so as to be able to communicate with each other.

The lens unit 11401 is an optical system provided at a connecting portion with the lens barrel 11101. The observation light taken in from the distal end of the lens barrel 11101 is guided to the camera head 11102 and is incident on the lens unit 11401. The lens unit 11401 is constituted by combining a plurality of lenses including a zoom lens and a focus lens.

The number of the imaging elements constituting the imaging unit 11402 may be one (so-called single plate type) or two or more (so-called multi-plate type). In a case where the imaging unit 11402 is configured as a multi-plate type, for example, respective image signals corresponding to RGB may be generated by each imaging element, and a color image may be obtained by merging these image signals. Alternatively, the imaging unit 11402 may be configured such that the imaging unit 11402 includes a pair of imaging elements for separately acquiring image signals for right eye and left eye compatible with the three-dimensional (3D) display. Owing to that the 3D display is performed, the operating surgeon 11131 can more accurately grasp the depth of the living tissue in the surgical site. Note that, in a case where the imaging unit 11402 is configured as a multi-plate type, the lens units 11401 can also be provided as a plurality of systems corresponding to respective imaging elements.

Furthermore, the imaging unit 11402 is not necessarily provided in the camera head 11102. For example, the imaging unit 11402 may be provided inside the lens barrel 11101 immediately behind the objective lens.

The driving unit 11403 is constituted by an actuator and moves the zoom lens and the focus lens of the lens unit 11401 by a predetermined distance along the optical axis under the control of the camera head control part 11405. With this movement, the magnification and the focus of the captured image by the imaging unit 11402 can be appropriately adjusted.

The communication unit 11404 is constituted by a communication apparatus for transmitting and receiving various types of information to and from the CCU 11201. The communication unit 11404 transmits the image signal obtained from the imaging unit 11402 as RAW data to the CCU 11201 via the transmission cable 11400.

Furthermore, the communication unit 11404 receives the control signal for controlling driving of the camera head 11102 from the CCU 11201 and supplies the received control signal to the camera head control part 11405. This control signal includes, for example, information regarding imaging conditions, such as information to specify a frame rate of the captured image, information to specify an exposure value at the time of imaging, and/or information to specify the magnification and focus of the captured image.

Note that the above-mentioned imaging conditions such as the frame rate, exposure value, magnification, and focus may be appropriately specified by the user, or may be automatically set by the control part 11413 of the CCU 11201 on the basis of the acquired image signal. The latter case means that so-called auto exposure (AE) function, auto focus (AF) function, and auto white balance (AWB) function are equipped in the endoscope 11100.

The camera head control part 11405 controls driving of the camera head 11102 on the basis of the control signal received from the CCU 11201 via the communication unit 11404.

The communication unit 11411 is constituted by a communication apparatus for transmitting and receiving various types of information to and from the camera head 11102. The communication unit 11411 receives the image signal transmitted from the camera head 11102 via the transmission cable 11400.

Furthermore, the communication unit 11411 transmits the control signal for controlling driving of the camera head 11102 to the camera head 11102. The image signal and the control signal can be transmitted by electrical communication, optical communication, or the like.

The image processing unit 11412 carries out various image processes on the image signal, which is RAW data transmitted from the camera head 11102.

The control part 11413 performs various types of control relating to imaging of the surgical site or the like by the endoscope 11100 and display of the captured image obtained by the imaging of the surgical site or the like. For example, the control part 11413 generates a control signal for controlling driving of the camera head 11102.

Furthermore, the control part 11413 displays the captured image in which the surgical site or the like appears on the display apparatus 11202 on the basis of the image signal on which the image processes have been carried out by the image processing unit 11412. At this time, the control part 11413 may recognize various objects in the captured image using various image recognition technologies. For example, the control part 11413 detects the shape, color, and the like of the edge of an object included in the captured image, thereby being able to recognize a surgical tool such as the forceps, a particular living body part, bleeding, a mist at the time of using the energy treatment instrument 11112, and the like. When displaying the captured image on the display apparatus 11202, the control part 11413 may display various types of surgery support information superimposed onto this image of the surgical site using results of the recognition. Since the surgery support information is displayed superimposed and presented to the operating surgeon 11131, the burden on the operating surgeon 11131 can be reduced and the operating surgeon 11131 can advance surgery reliably.

The transmission cable 11400 connecting the camera head 11102 and the CCU 11201 is an electrical signal cable compatible with communication of electrical signals, an optical fiber compatible with optical communication, or a composite cable thereof.

Here, in the illustrated example, communication is performed by wire using the transmission cable 11400; however, communication between the camera head 11102 and the CCU 11201 may be performed wirelessly.

An example of the endoscopic surgery system to which the technology according to the present disclosure can be applied has been described thus far. The technology according to the present disclosure can be applied to the endoscope 11100 and the camera head 11102 in the configuration described above. Specifically, the imaging apparatus 100 in FIG. 1 can be used as the endoscope 11100 and the camera head 11102. By applying the technology according to the present disclosure to the endoscope 11100 or the like, a clear image of the surgical site can be obtained, such that the operating surgeon can reliably check the surgical site.

Note that, although an endoscopic surgery system has been described here as an example, the technology according to the present disclosure may be applied to other surgery systems such as a microscopic surgery system, for example.

6. Application Example to Moving Body

The technology according to the present disclosure (present technology) can be applied to a variety of products. For example, the technology according to the present disclosure may be implemented as an apparatus to be equipped in any type of moving body such as automobile, electric automobile, hybrid electric automobile, motorcycle, bicycle, personal mobility, airplane, drone, ship, and robot.

Figure 21:
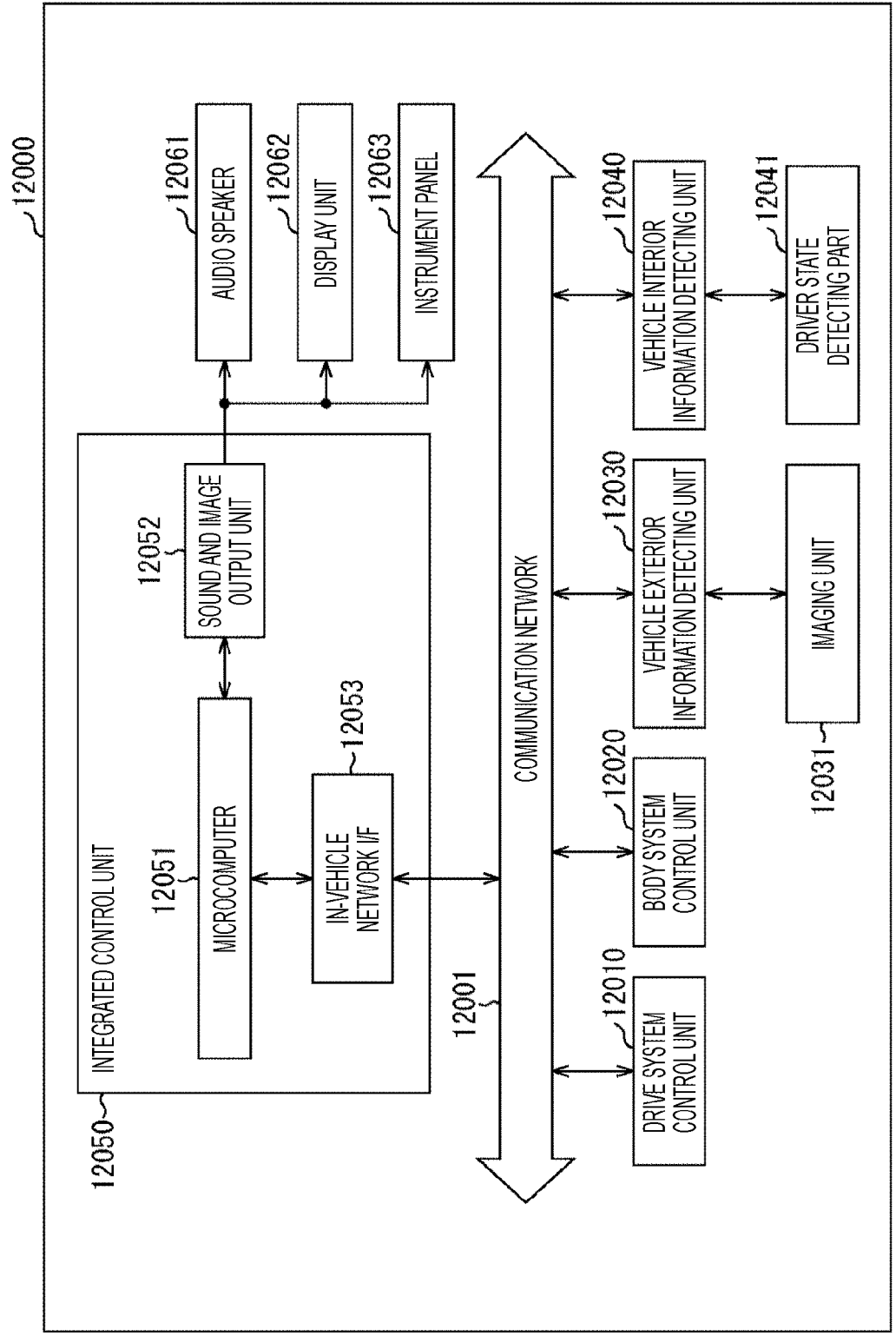
FIG. 21 is a block diagram illustrating an example of a schematic configuration of a vehicle control system.

FIG. 21 is a block diagram illustrating a schematic configuration example of a vehicle control system, which is an example of a moving body control system to which the technology according to the present disclosure can be applied.

The vehicle control system 12000 includes a plurality of electronic control units connected via a communication network 12001. In the example illustrated in FIG. 21, the vehicle control system 12000 includes a drive system control unit 12010, a body system control unit 12020, a vehicle exterior information detecting unit 12030, a vehicle interior information detecting unit 12040, and an integrated control unit 12050. Furthermore, as a functional configuration of the integrated control unit 12050, a microcomputer 12051, a sound and image output unit 12052, and an in-vehicle network interface (I/F) 12053 are illustrated.

The drive system control unit 12010 controls working of an apparatus related to a drive system of the vehicle in accordance with various programs. For example, the drive system control unit 12010 functions as a driving force generating apparatus for generating a driving force of the vehicle, such as an internal combustion engine or a driving motor, a driving force transmitting mechanism for transmitting a driving force to wheels, a steering mechanism that regulates a steer angle of the vehicle, and a control apparatus such as a braking apparatus that generates a braking force of the vehicle.

The body system control unit 12020 controls working of various apparatuses arranged in the vehicle body in accordance with various programs. For example, the body system control unit 12020 functions as a keyless entry system, a smart key system, a power window apparatus, or a control apparatus for various lamps such as a headlamp, a back lamp, a brake lamp, a turn signal lamp, or a fog lamp. In this case, the body system control unit 12020 can accept input of a radio wave distributed from a portable device that substitutes a key or signals from various switches. The body system control unit 12020 accepts input of the above-mentioned radio wave or signals and controls a door lock apparatus, the power window apparatus, the lamp, and the like of the vehicle.

The vehicle exterior information detecting unit 12030 detects information outside the vehicle equipped with the vehicle control system 12000. For example, an imaging unit 12031 is connected to the vehicle exterior information detecting unit 12030. The vehicle exterior information detecting unit 12030 causes the imaging unit 12031 to capture an image of the outside of the vehicle and receives an image that has been captured. The vehicle exterior information detecting unit 12030 may perform an object detection process or a distance detection process for a person, a car, an obstacle, a sign, a character on a road surface, or the like on the basis of the received image.

The imaging unit 12031 is an optical sensor that receives light and outputs an electrical signal according to the amount of the received light. The imaging unit 12031 can output an electrical signal as an image, or can also output an electrical signal as distance measurement information. Furthermore, light received by the imaging unit 12031 may be visible light or invisible light such as an infrared ray.

The vehicle interior information detecting unit 12040 detects information inside the vehicle. For example, a driver state detecting part 12041 that detects the state of the driver is connected to the vehicle interior information detecting unit 12040. The driver state detecting part 12041 includes, for example, a camera that images the driver, and the vehicle interior information detecting unit 12040 may calculate the degree of fatigue or the degree of concentration of the driver or may discriminate whether or not the driver is dozing off, on the basis of detection information input from the driver state detecting part 12041.

The microcomputer 12051 can compute a control target value for the driving force generating apparatus, the steering mechanism, or the braking apparatus on the basis of the information inside and outside the vehicle acquired by the vehicle exterior information detecting unit 12030 or the vehicle interior information detecting unit 12040, and can output a control command to the drive system control unit 12010. For example, the microcomputer 12051 can perform coordinative control for the purpose of implementing the function of advanced driver assistance system (ADAS) including vehicle collision avoidance or impact mitigation, follow-up running based on inter-vehicle distance, vehicle speed maintenance running, vehicle collision warning, vehicle lane departure warning, or the like.

Furthermore, the microcomputer 12051 can control the driving force generating apparatus, the steering mechanism, the braking apparatus, or the like on the basis of the information around the vehicle acquired by the vehicle exterior information detecting unit 12030 or the vehicle interior information detecting unit 12040, so as to perform coordinative control for the purpose of, for example, the automated driving in which the vehicle autonomously runs without depending on the driver's operation.

In addition, the microcomputer 12051 can output a control command to the body system control unit 12020 on the basis of information outside the vehicle acquired by the vehicle exterior information detecting unit 12030. For example, the microcomputer 12051 can control the headlamps according to the position of a preceding vehicle or oncoming vehicle found by the vehicle exterior information detecting unit 12030, and can perform coordinative control for the purpose of anti-glare, such as switching from a high beam to a low beam.

The sound and image output unit 12052 transmits an output signal of at least one of a sound or an image to an output apparatus capable of visually or audibly notifying an occupant of the vehicle or the outside of the vehicle of information. In the example in FIG. 21, an audio speaker 12061, a display unit 12062, and an instrument panel 12063 are exemplified as output apparatuses. For example, the display unit 12062 may include at least one of an on-board display or a head-up display.

Figure 22:
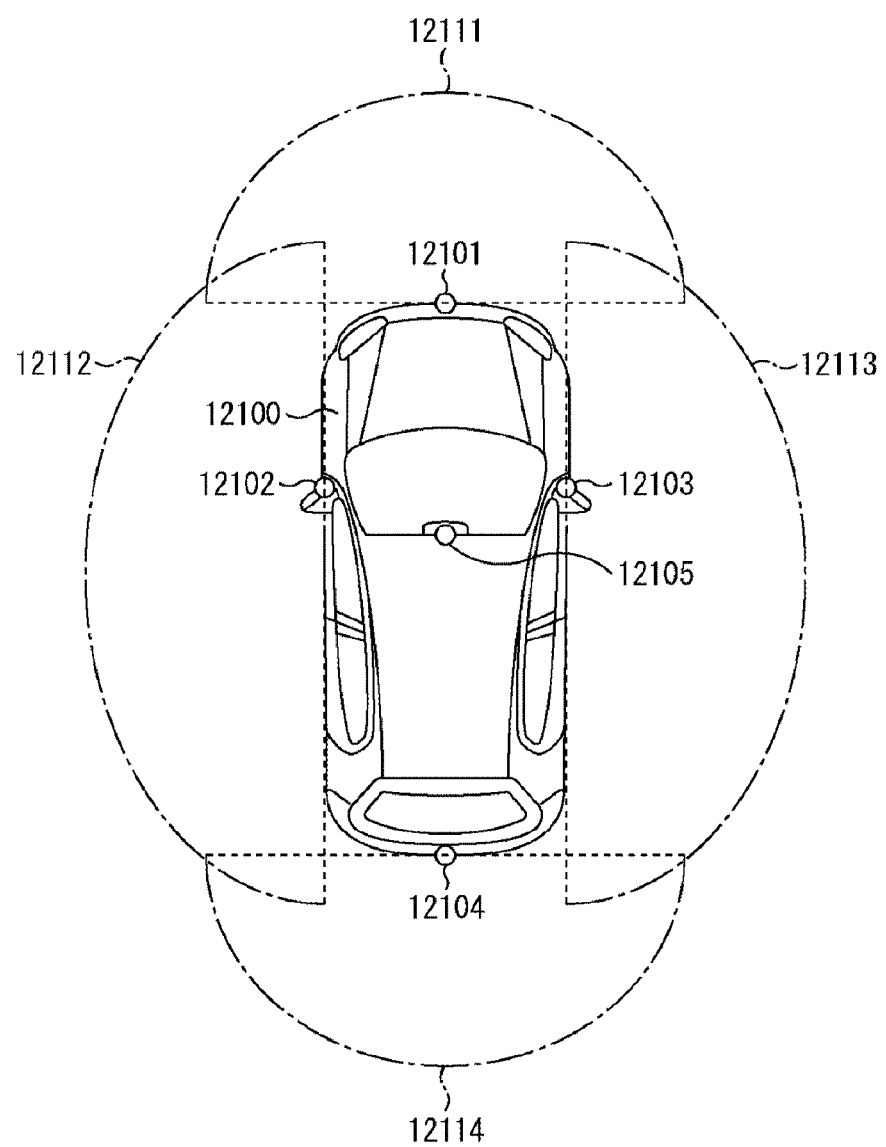
FIG. 22 is an explanatory diagram illustrating an example of installation positions of imaging units.

FIG. 22 is a diagram illustrating an example of installation positions of the imaging units 12031.

In FIG. 22, the imaging unit 12031 includes imaging units 12101, 12102, 12103, 12104, and 12105.

For example, the imaging units 12101, 12102, 12103, 12104, and 12105 are provided at positions such as a front nose, a side mirror, a rear bumper, a back door, and an upper portion of a windshield in a passenger compartment of a vehicle 12100. The imaging unit 12101 provided at the front nose and the imaging unit 12105 provided at the upper portion of the windshield in the passenger compartment mainly acquire an image ahead of the vehicle 12100. The imaging units 12102 and 12103 provided at the side mirrors mainly acquire images of the sides of the vehicle 12100. The imaging unit 12104 provided at the rear bumper or the back door mainly acquires an image behind the vehicle 12100. The imaging unit 12105 provided at the upper portion of the windshield in the passenger compartment is mainly used for detecting a preceding vehicle, a pedestrian, an obstacle, a traffic signal, a traffic sign, a lane, or the like.

Note that FIG. 22 illustrates an example of capturing ranges of the imaging units 12101 to 12104. An imaging range 12111 indicates an imaging range of the imaging unit 12101 provided at the front nose, imaging ranges 12112 and 12113 indicate imaging ranges of the imaging units 12102 and 12103 provided at the side mirrors, respectively, and an imaging range 12114 indicates an imaging range of the imaging unit 12104 provided at the rear bumper or the back door. For example, by overlapping image data captured by the imaging units 12101 to 12104, an overhead view image of the vehicle 12100 viewed from above is obtained.

At least one of the imaging units 12101 to 12104 may have a function of acquiring distance information. For example, at least one of the imaging units 12101 to 12104 may be a stereo camera constituted by a plurality of imaging elements, or may be an imaging element having pixels for phase difference detection.

For example, the microcomputer 12051 works out, from the distance information obtained from the imaging units 12101 to 12104, a distance to each three-dimensional object in the imaging ranges 12111 to 12114, and the temporal change in this distance (relative speed with respect to the vehicle 12100), thereby being able to extract, as a preceding vehicle, particularly a closest three-dimensional object that is present on the traveling path of the vehicle 12100 and runs at a predetermined speed (for example, 0 km/h or higher) in substantially the same direction as the vehicle 12100. Moreover, the microcomputer 12051 can set an inter-vehicle distance to be secured in advance behind the preceding vehicle, and can perform automatic brake control (including follow-up stop control), automatic acceleration control (including follow-up start control), and the like. In this manner, coordinative control for the purpose of automated driving or the like that allows to run autonomously without depending on the driver's operation can be performed.

For example, the microcomputer 12051 can classify three-dimensional object data relating to three-dimensional objects into two-wheeled vehicles, ordinary vehicles, large vehicles, pedestrians, and other three-dimensional objects such as power poles, with reference to the distance information obtained from the imaging units 12101 to 12104 to extract, and can use the extracted data for automatic avoidance of obstacles. For example, the microcomputer 12051 identifies neighboring obstacles of the vehicle 12100 as an obstacle that can be visually recognized by the driver of the vehicle 12100 and an obstacle that are difficult to visually recognize. Then, the microcomputer 12051 can estimate a collision risk indicating the degree of danger of collision with each obstacle and, when a situation is such that the collision risk is equal to or higher than a set value and a collision is likely to happen, can perform driving assistance for collision avoidance by outputting an alarm to the driver via the audio speaker 12061 and the display unit 12062, or performing forced deceleration or avoidance steering via the drive system control unit 12010.

At least one of the imaging units 12101 to 12104 may be an infrared camera that detects an infrared ray. For example, the microcomputer 12051 can recognize a pedestrian by determining whether or not a pedestrian is present in the captured images of the imaging units 12101 to 12104. Such pedestrian recognition is performed, for example, by the procedure of extracting feature points in the captured images of the imaging units 12101 to 12104 as infrared cameras, and the procedure of performing a pattern matching process on a sequence of feature points indicating a contour of an object to discriminate whether or not the object is a pedestrian. When the microcomputer 12051 determines that a pedestrian is present in the captured images of the imaging units 12101 to 12104 and recognizes the pedestrian, the sound and image output unit 12052 controls the display unit 12062 so as to display a quadrangular contour frame for emphasizing the recognized pedestrian in a superimposed manner. Furthermore, the sound and image output unit 12052 may control the display unit 12062 so as to display an icon or the like indicating a pedestrian at a desired position.

An example of the vehicle control system to which the technology according to the present disclosure can be applied has been described thus far. The technology according to the present disclosure can be applied to the imaging unit 12031 in the configuration described above. Specifically, the imaging apparatus 100 in FIG. 1 can be used as the imaging unit 12031. By applying the technology according to the present disclosure to the imaging unit 12031, a captured image that is easy to see can be obtained, such that driver's fatigue can be reduced.

Note that the above-described embodiments illustrate examples for embodying the present technology and matters in the embodiments and invention specifying matters in the claims individually have correspondence relationships. Likewise, the invention specifying matters in the claims and the matters in the embodiments of the present technology denoted by the same names as those in the claims individually have correspondence relationships. However, the present technology is not limited to the embodiments and can be embodied by subjecting the embodiments to various modifications without departing from the gist thereof.

Note that the present technology can be also configured as described below.

(1) An imaging apparatus including:

a sensor chip in which a solid-state imaging element is provided in a light receiving region;

a transparent substrate equipped on an outer edge portion of the sensor chip;

a light shielding wall that shields light that passes through the transparent substrate and enters the light receiving region; and an optical filter on which the light shielding wall is formed.

(2) The imaging apparatus according to (1) above, further including a flexible material filled between the light shielding wall and the transparent substrate.

(3) The imaging apparatus according to (1) or (2) above, in which the light shielding wall includes a cured ultraviolet curable resin.

(4) The imaging apparatus according to (1) or (2) above, in which the light shielding wall includes a cured thermosetting resin.

(5) The imaging apparatus according to any one of (1) to (4) above, in which the light shielding wall has an L-shaped cross section, and an inner edge portion of the transparent substrate is provided with a step that restricts a movement of the optical filter in a direction parallel to a plane of the sensor chip.

(6) The imaging apparatus according to any one of (1) to (5) above, in which the light shielding wall protrudes in a direction perpendicular to the light receiving region, and the light shielding wall is formed in a vicinity of the wiring substrate on a surface of the optical filter facing the light receiving region, out of two surfaces of the optical filter.

(7) The imaging apparatus according to (6) above, further including:

a lens barrel; and a partition plate whose side surface is connected to an inner wall of the lens barrel, in which a surface of the optical filter on which the light shielding wall is not formed, out of the two surfaces of the optical filter, is adhered to the partition plate.

(8) A manufacturing method for an imaging apparatus, the manufacturing method including:

a light shielding wall forming procedure of forming a light shielding wall that shields light that passes through a transparent substrate and enters a light receiving region, on an optical filter; and a substrate equipping procedure of equipping the transparent substrate on an outer edge portion of a sensor chip in which a solid-state imaging element is provided in the light receiving region.

(9) The manufacturing method according to (8) above, in which the light shielding wall forming procedure includes:

an application procedure of applying an ultraviolet curable resin to the optical filter;

a masking procedure of masking a predetermined part of the optical filter applied with the ultraviolet curable resin; and an exposure procedure of forming the light shielding wall by exposing the masked optical filter to an ultraviolet ray.

(10) The manufacturing method according to (8) above, in which the light shielding wall forming procedure includes:

an application procedure of applying a thermosetting resin to the optical filter applied with a thermosetting resin; and a procedure of patterning the thermosetting resin into a predetermined shape using a mold in the optical filter applied with the thermosetting resin.

REFERENCE SIGNS LIST

100 Imaging apparatus
110 Lens barrel
120 Imaging lens
130 Partition plate
135, 165 Adhesive
140 Optical filter
150 Light shielding wall
155 Temporary adhesive
156 Flexible material
160, 161 Wiring substrate
170 Sensor chip
175 Solid-state imaging element
210 Ultraviolet curable resin
220, 221 Mask
310 Thermosetting resin
320 Mold
11102 Camera head
11201 CCU
12031 Imaging unit

What is claimed is:

1. An imaging apparatus, comprising:
a sensor chip in which a solid-state imaging element is provided in a light receiving region;
a transparent substrate equipped on an outer edge portion of the sensor chip;
a light shielding wall that shields light that passes through the transparent substrate and enters the light receiving region; and
an optical filter on which the light shielding wall is formed,
wherein there is no physical contact between the transparent substrate and the optical filter.

2. The imaging apparatus according to claim 1, further comprising a flexible material filled between the light shielding wall and the transparent substrate.

3. The imaging apparatus according to claim 1, wherein the light shielding wall includes a cured ultraviolet curable resin.

4. The imaging apparatus according to claim 1, wherein the light shielding wall includes a cured thermosetting resin.

5. The imaging apparatus according to claim 1, wherein the light shielding wall has an L-shaped cross section, and
wherein an inner edge portion of the transparent substrate is provided with a step that restricts a movement of the optical filter in a direction parallel to a plane of the sensor chip.

6. The imaging apparatus according to claim 1, wherein the light shielding wall protrudes in a direction perpendicular to the light receiving region, and
wherein the light shielding wall is formed in a vicinity of the transparent substrate on a surface of the optical filter facing the light receiving region, out of two surfaces of the optical filter.

7. The imaging apparatus according to claim 6, further comprising:
a lens barrel; and
a partition plate whose side surface is connected to an inner wall of the lens barrel, wherein
a surface of the optical filter on which the light shielding wall is not formed, out of the two surfaces of the optical filter, is adhered to the partition plate.

8. The imaging apparatus according to claim 1, wherein there is no physical contact between the transparent substrate and the light shielding wall.

9. The imaging apparatus according to claim 1, wherein there is no physical contact between the light shielding wall and the sensor chip.

10. The imaging apparatus according to claim 1, wherein a gap is provided between the transparent substrate and the light shielding wall.

11. The imaging apparatus according to claim 1, wherein a gap is provided between the light shielding wall and the sensor chip.

12. The imaging apparatus according to claim 1, wherein a gap is provided between the transparent substrate and the optical filter.

13. A manufacturing method for an imaging apparatus, the manufacturing method comprising:
a light shielding wall forming procedure of forming a light shielding wall that shields light that passes through a transparent substrate and enters a light receiving region, on an optical filter; and
a substrate equipping procedure of equipping the transparent substrate on an outer edge portion of a sensor chip in which a solid-state imaging element is provided in the light receiving region,
wherein there is no physical contact between the transparent substrate and the optical filter.

14. The manufacturing method according to claim 13, wherein
the light shielding wall forming procedure includes:
an application procedure of applying an ultraviolet curable resin to the optical filter;
a masking procedure of masking a predetermined part of the optical filter applied with the ultraviolet curable resin; and
an exposure procedure of forming the light shielding wall by exposing the masked optical filter to an ultraviolet ray.

15. The manufacturing method according to claim 13, wherein
the light shielding wall forming procedure includes:
an application procedure of applying a thermosetting resin to the optical filter applied with a thermosetting resin; and a procedure of patterning the thermosetting resin into a predetermined shape using a mold in the optical filter applied with the thermosetting resin.

16. The manufacturing method according to claim 13, wherein there is no physical contact between the transparent substrate and the light shielding wall.

17. The manufacturing method according to claim 13, wherein there is no physical contact between the light shielding wall and the sensor chip.

18. The manufacturing method according to claim 13, wherein a gap is provided between the transparent substrate and the light shielding wall.

19. The manufacturing method according to claim 13, wherein a gap is provided between the light shielding wall and the sensor chip.

20. The manufacturing method according to claim 13, wherein a gap is provided between the transparent substrate and the optical filter.

\* \* \* \* \*